United States Patent [19]
Tanaka et al.

[11] Patent Number: 5,815,436
[45] Date of Patent: Sep. 29, 1998

[54] MULTI-LEVEL NONVOLATILE SEMICONDUCTOR MEMORY DEVICE HAVING IMPROVED PROGRAMMING LEVEL AND READ/WRITE MULTI-LEVEL DATA CIRCUITS

[75] Inventors: Tomoharu Tanaka; Hiroaki Hazama, both of Yokohama, Japan

[73] Assignee: Kabushiki Kaisha Toshiba, Kawasaki, Japan

[21] Appl. No.: 748,401

[22] Filed: Nov. 13, 1996

[30] Foreign Application Priority Data

Nov. 14, 1995 [JP] Japan ...................................... 7-295136

[51] Int. Cl.⁶ .................................................... G11C 11/34
[52] U.S. Cl. ............... 365/185.03; 365/184; 365/189.03; 365/189.05
[58] Field of Search ............................. 365/184, 185.03, 365/189.03, 189.05

[56] References Cited

U.S. PATENT DOCUMENTS

| | | | |
|---|---|---|---|
| 5,043,940 | 8/1991 | Harari | 365/185.03 |
| 5,172,338 | 12/1992 | Mehrotra et al. | 365/185.03 |
| 5,268,870 | 12/1993 | Harari | 365/185.09 |
| 5,321,699 | 6/1994 | Endoh et al. | 365/185.17 |
| 5,422,842 | 6/1995 | Cernea et al. | 365/185.22 |
| 5,521,865 | 5/1996 | Ohuchi et al. | 365/185.22 |
| 5,555,204 | 9/1996 | Endoh et al. | 365/189.01 |
| 5,570,315 | 10/1996 | Tanaka et al. | 365/185.22 |
| 5,621,682 | 4/1997 | Tanzawa | 365/185.03 |

*Primary Examiner*—David C. Nelms
*Assistant Examiner*—Hoai Ho
*Attorney, Agent, or Firm*—Oblon, Spivak, McClelland, Maier & Neustadt, P.C.

[57] ABSTRACT

A nonvolatile semiconductor memory device includes a memory cell including a charge storage section for storing n-value data ($n \geq 3$). In this device, the charge storage section has discrete first to n-th charge amount regions for storing the n-value data. If the first to n-th charge amount regions are defined as n-th, (n−1)-th, ..., (i+1)-th, i-th charge amount regions descending order of an amount of positive or negative charge stored in the charge storage section, a charge amount difference $\Delta M_j$ between a j-th charge amount region and a (j−1)-th charge amount region is set to $\Delta M_n > \Delta M_{n-1} > ... > \Delta M_{i+2} > \Delta M_{i+1}$.

17 Claims, 21 Drawing Sheets

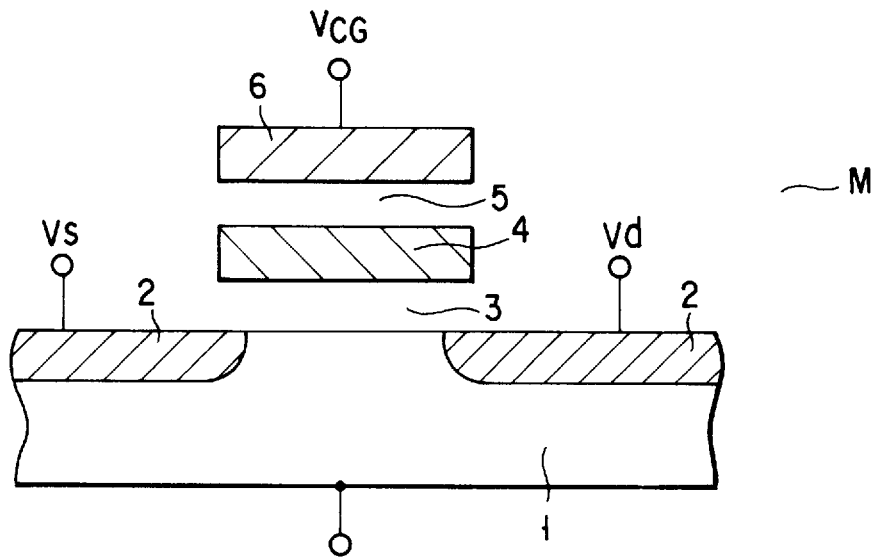
F I G. 1
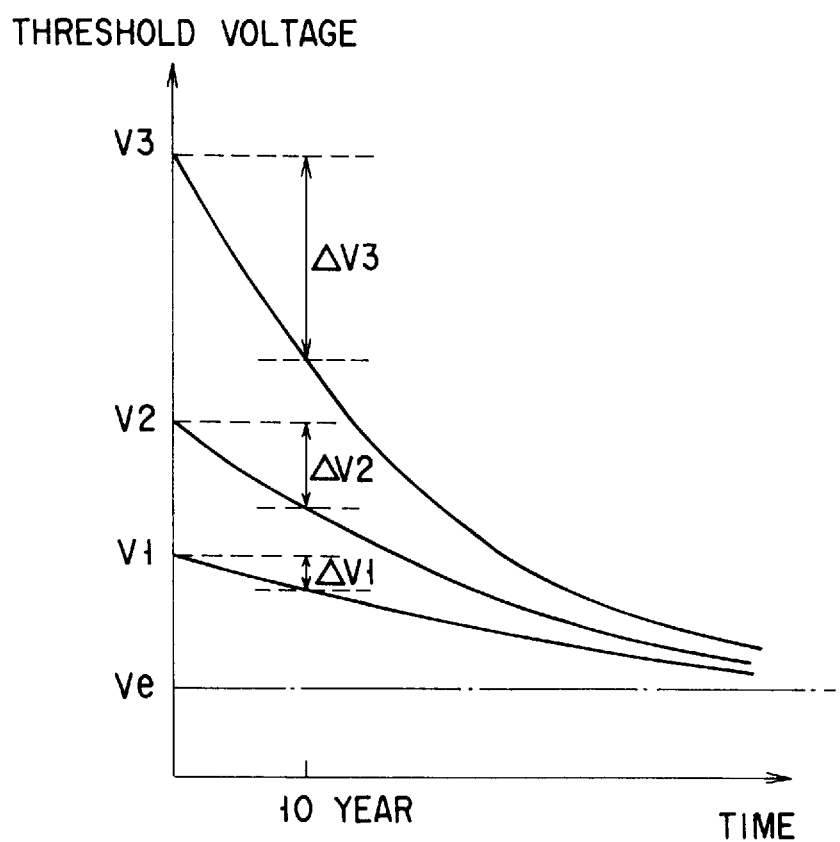
F I G. 2

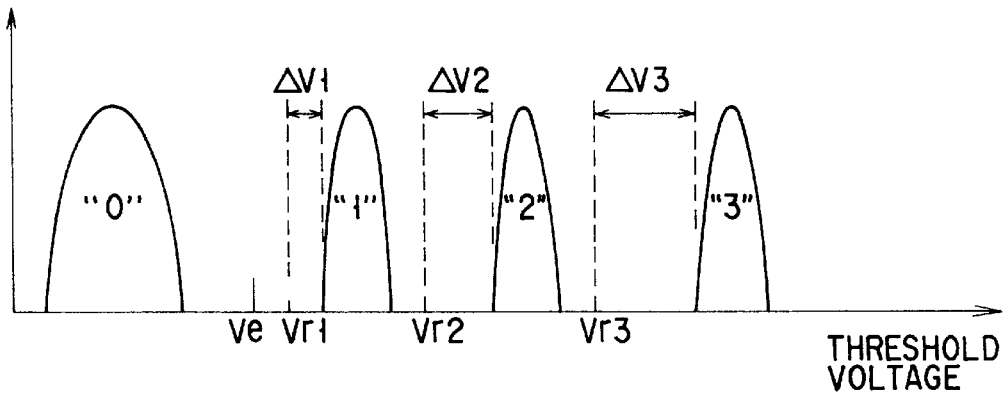
F I G. 4
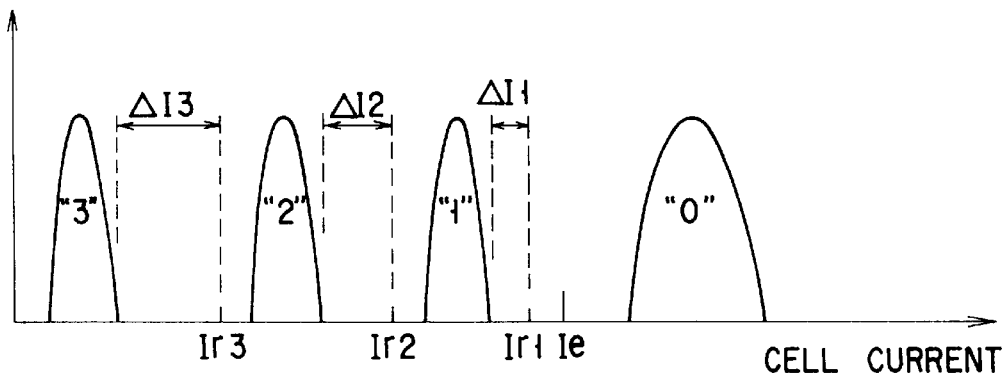
F I G. 5

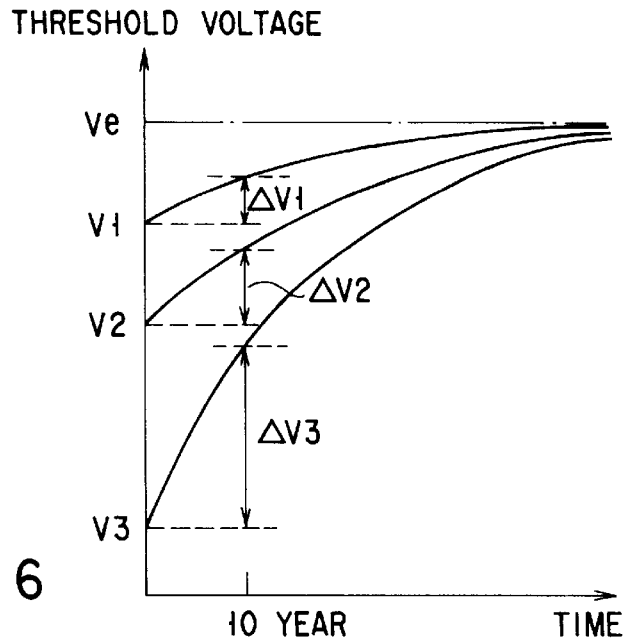
F I G. 6
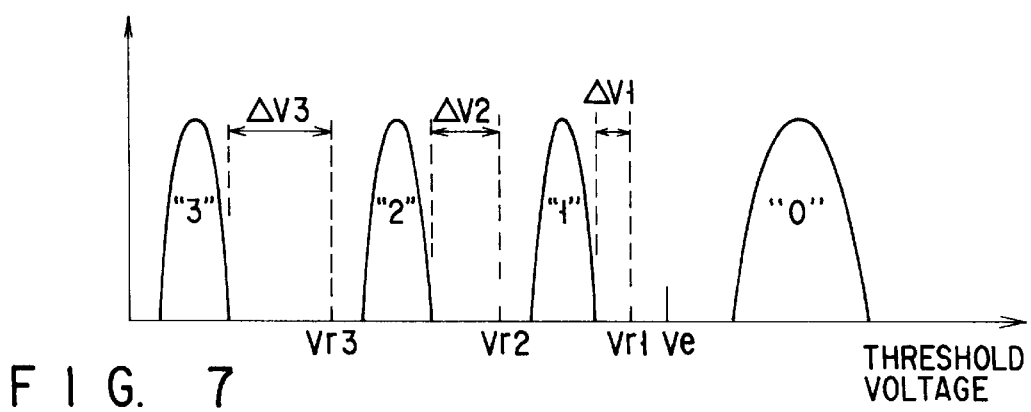
F I G. 7
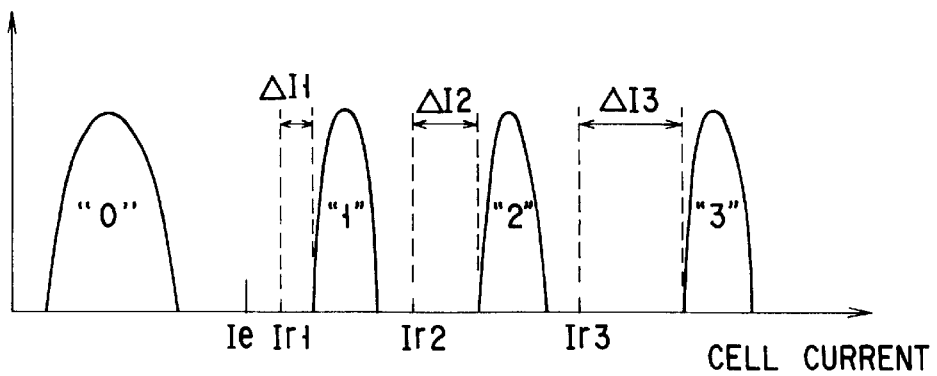
F I G. 8

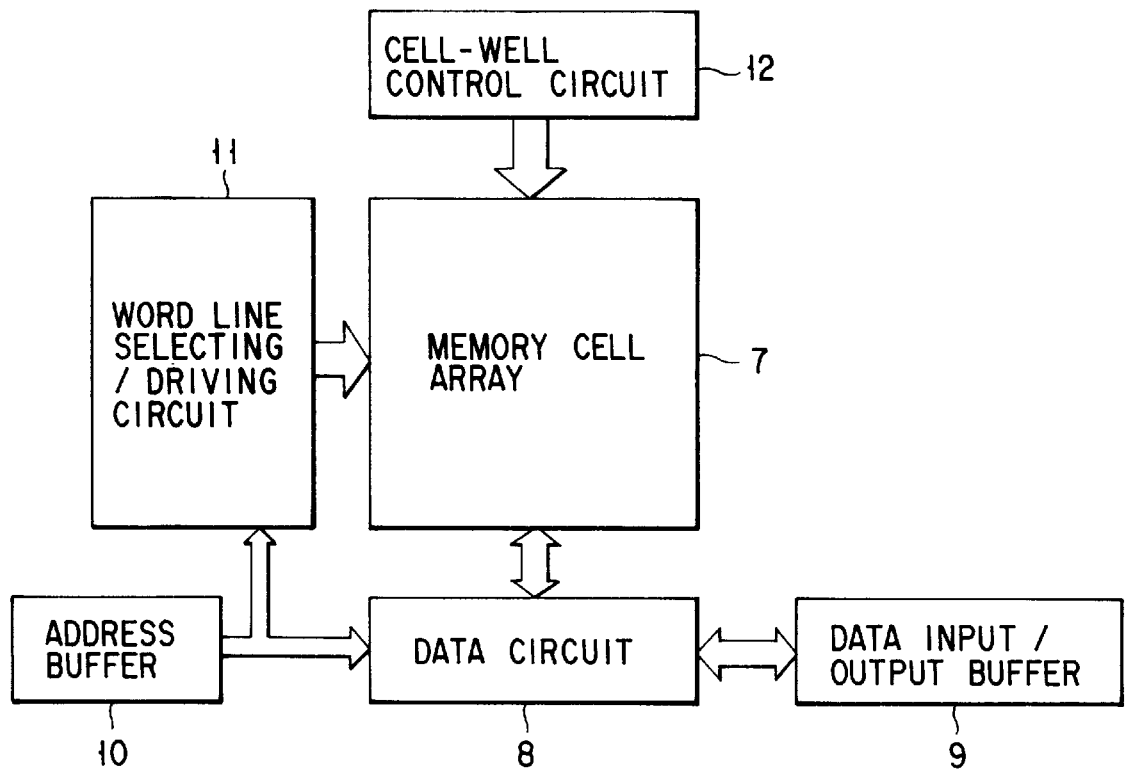
F I G. 9
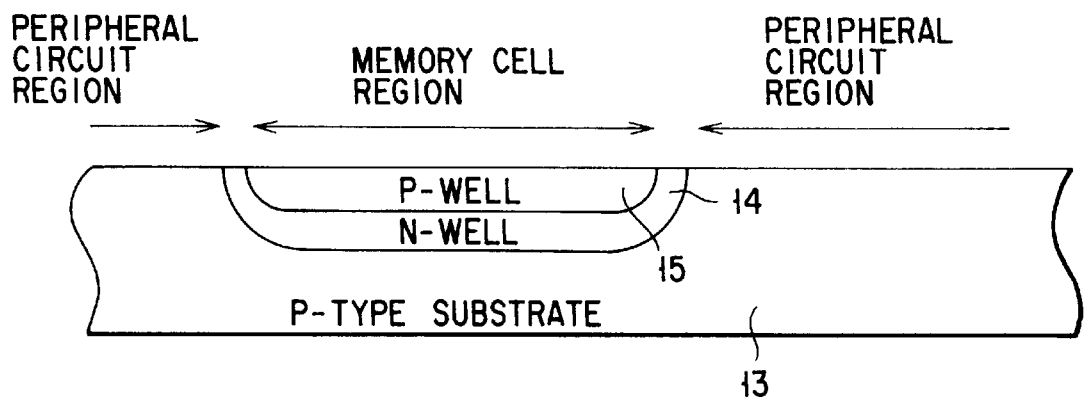
F I G. 10

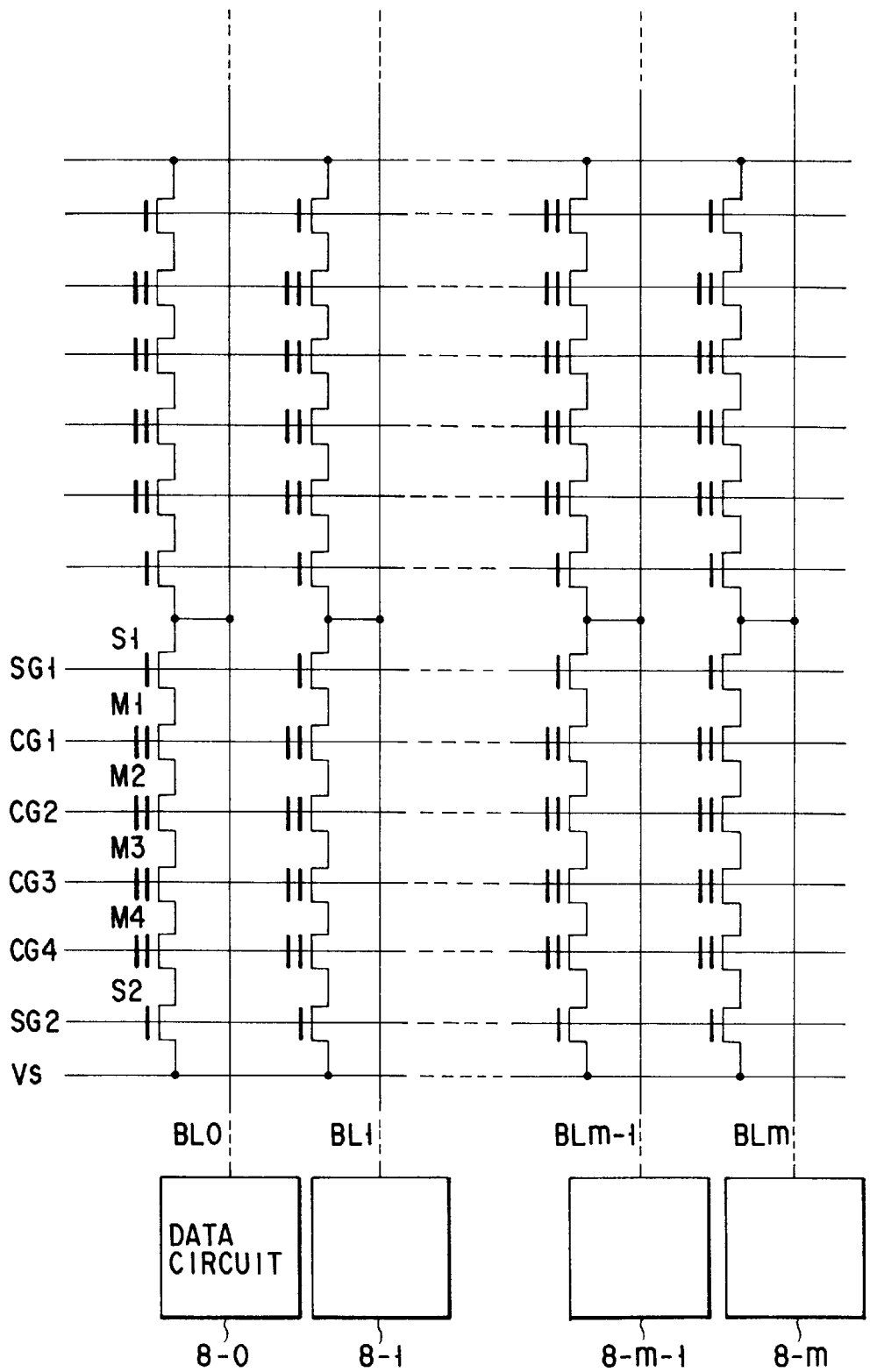
F I G. 11

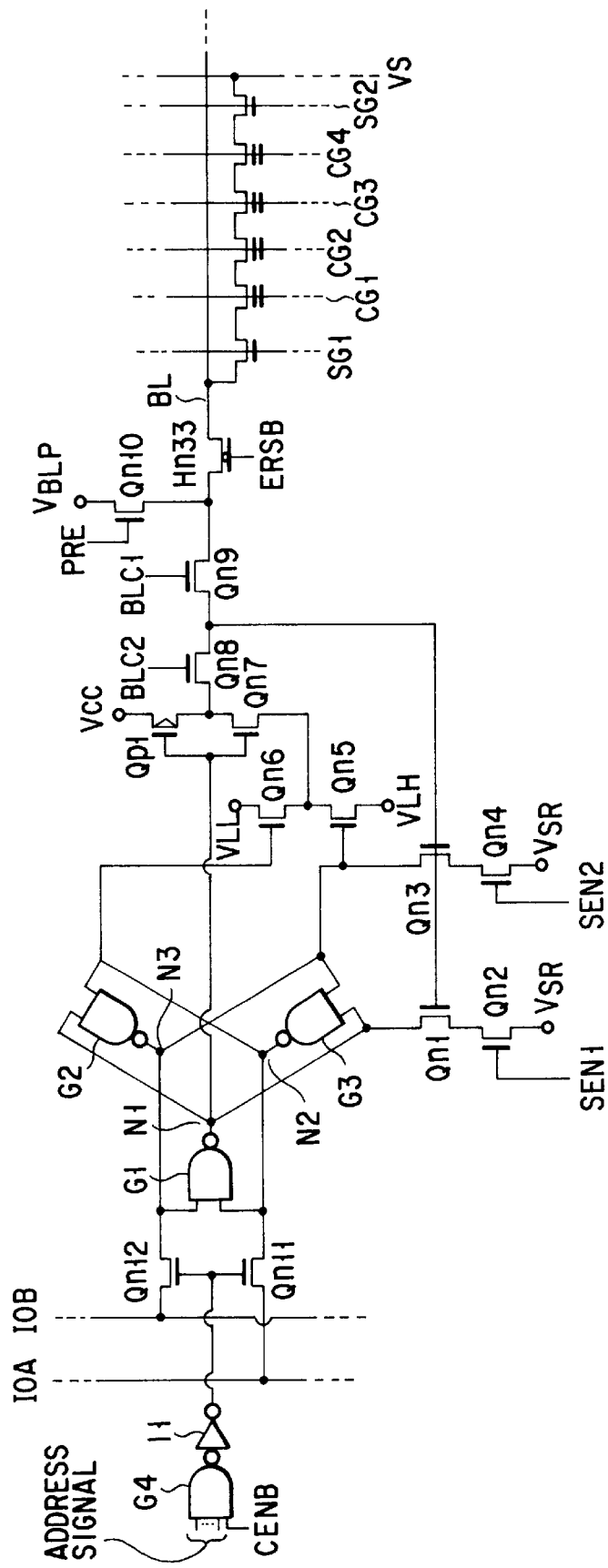
F I G. 12

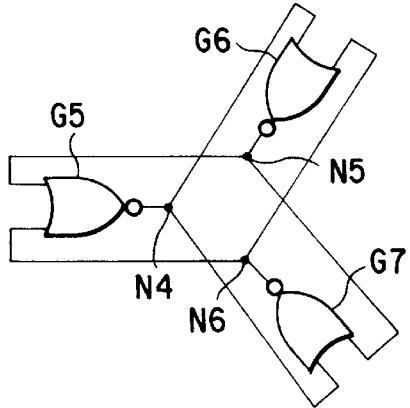
F I G. 13
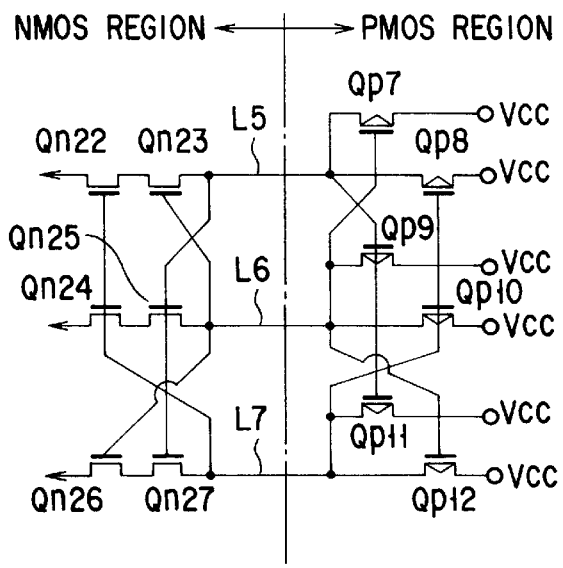
F I G. 16

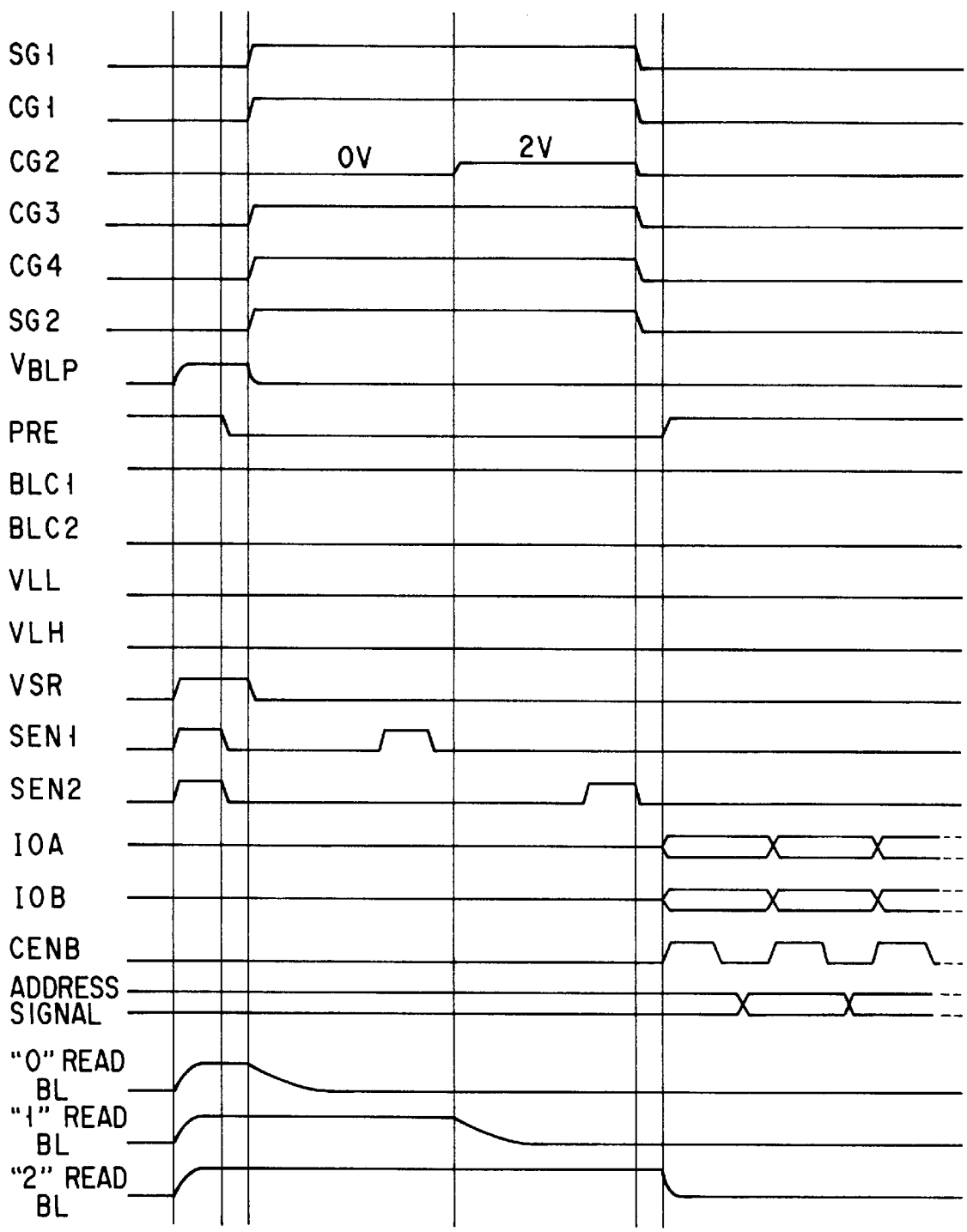
F I G. 17

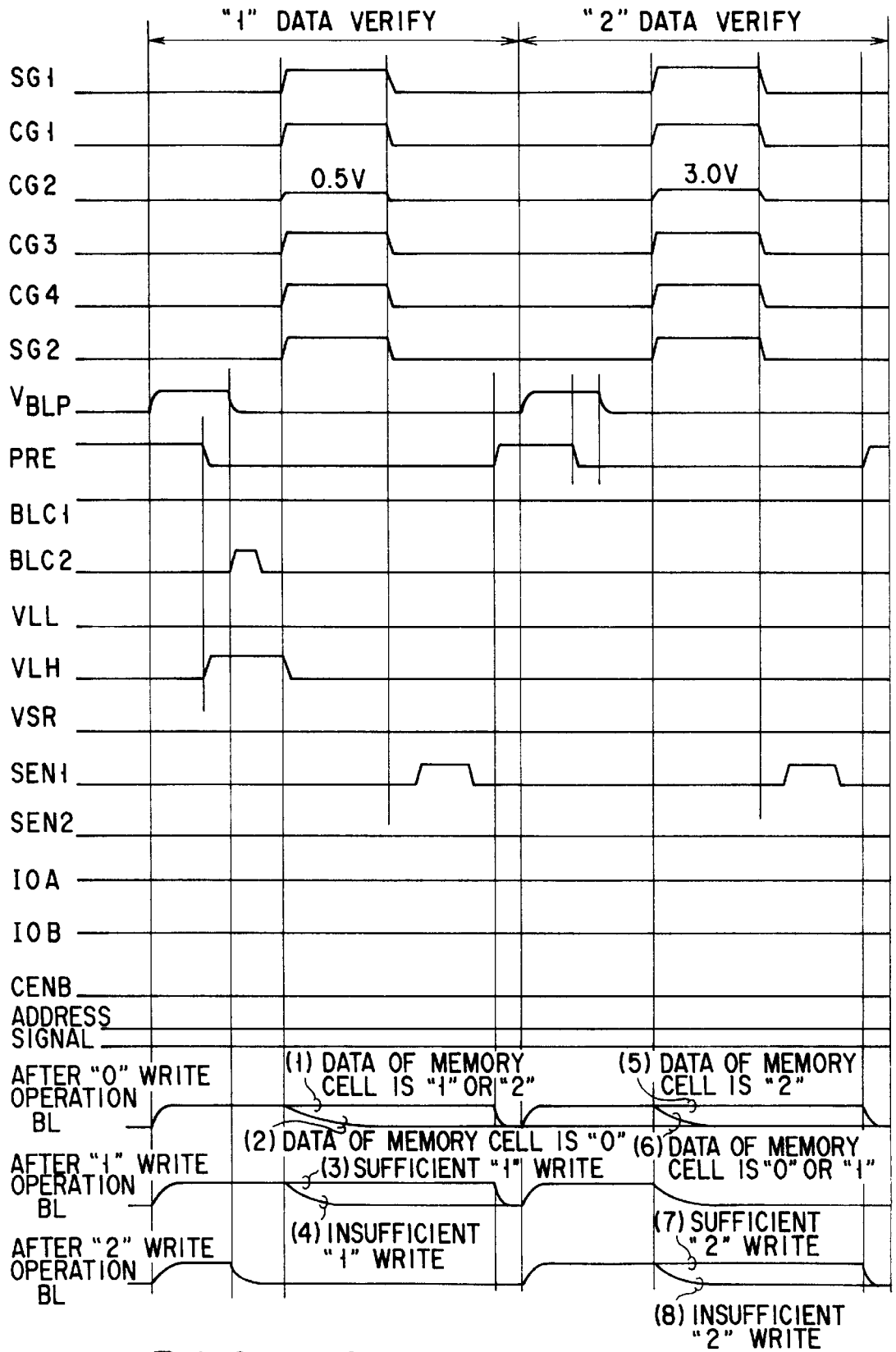
F I G. 19

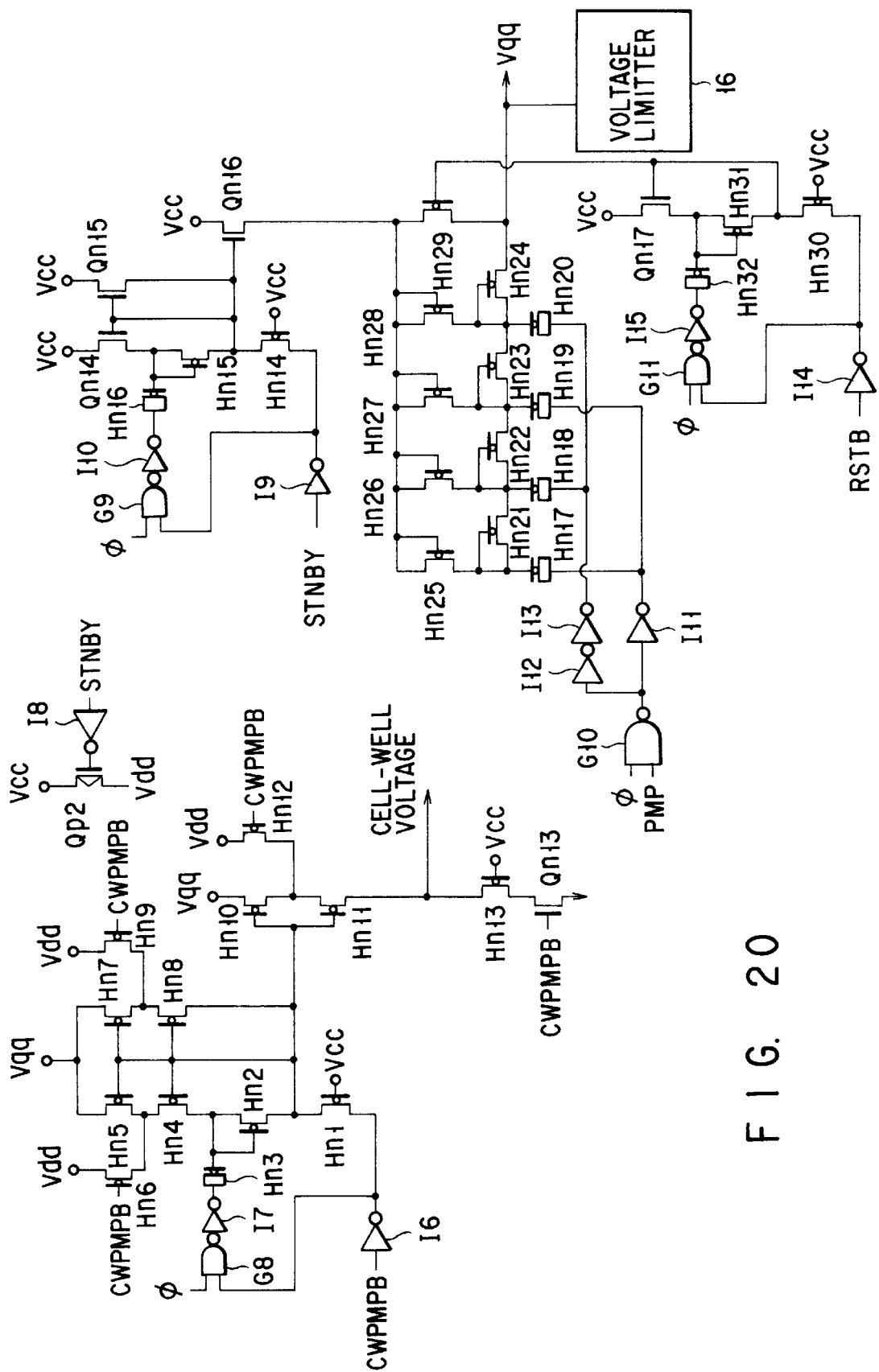
F I G. 20

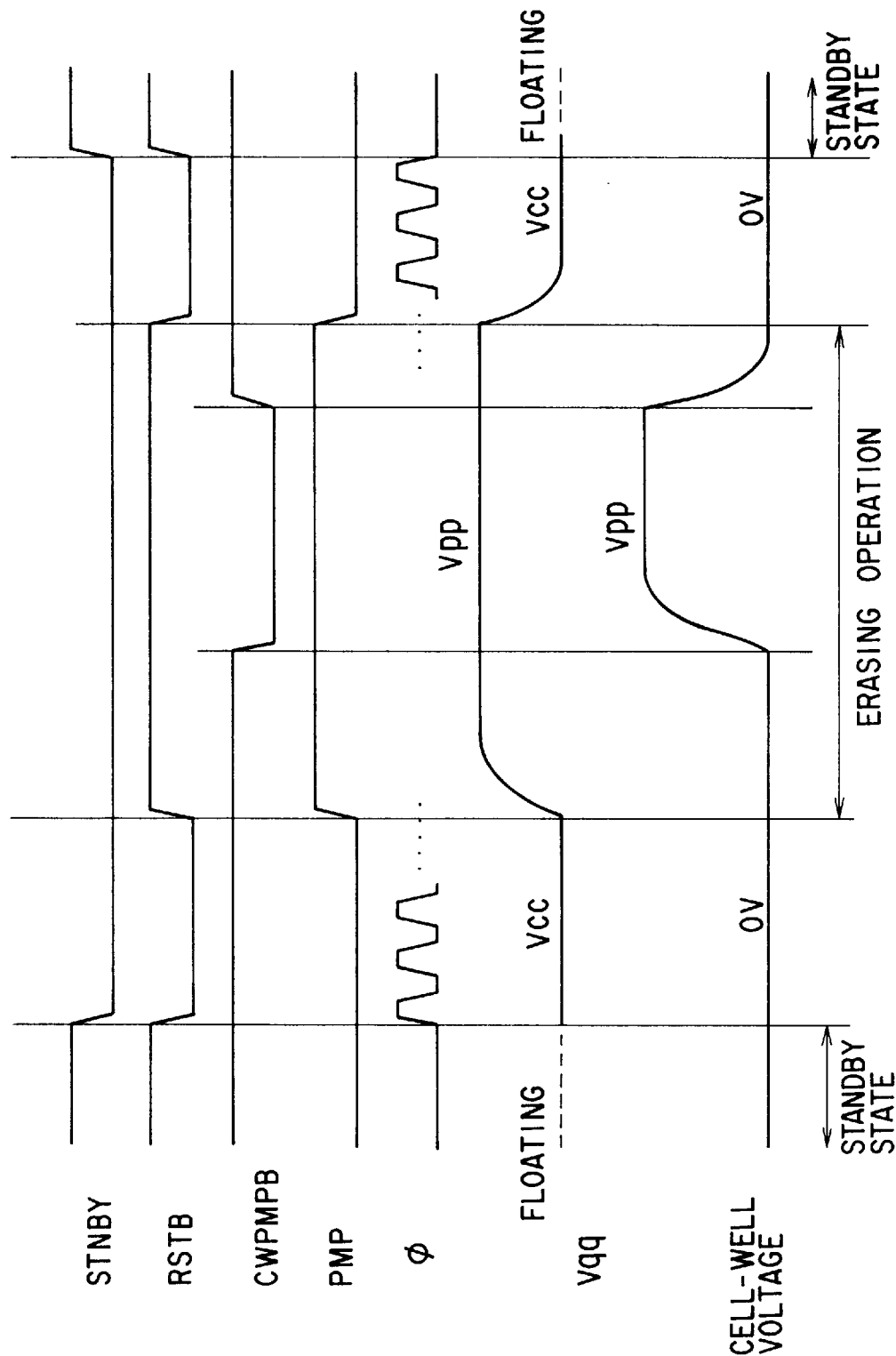
F I G. 21

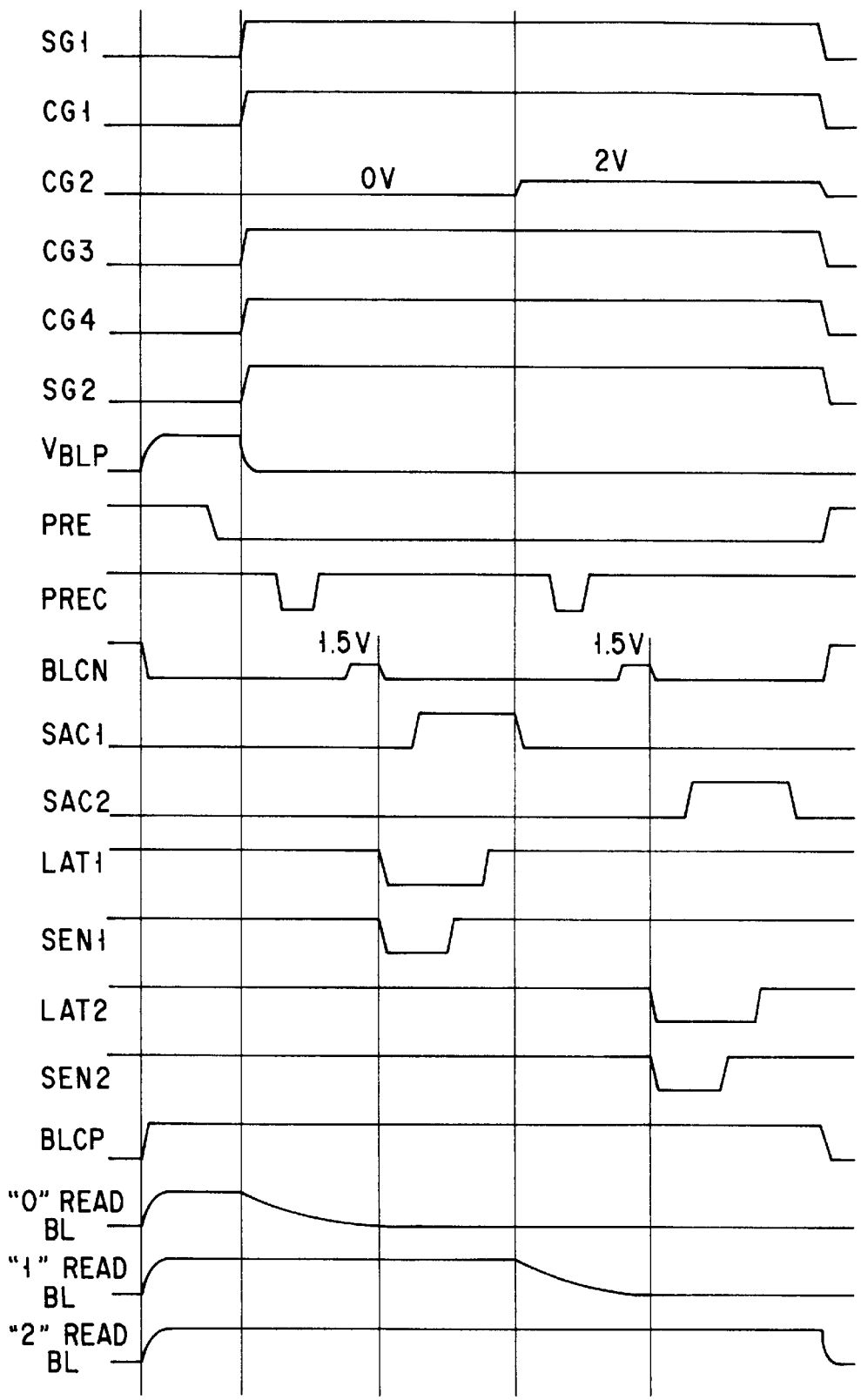
F I G. 23

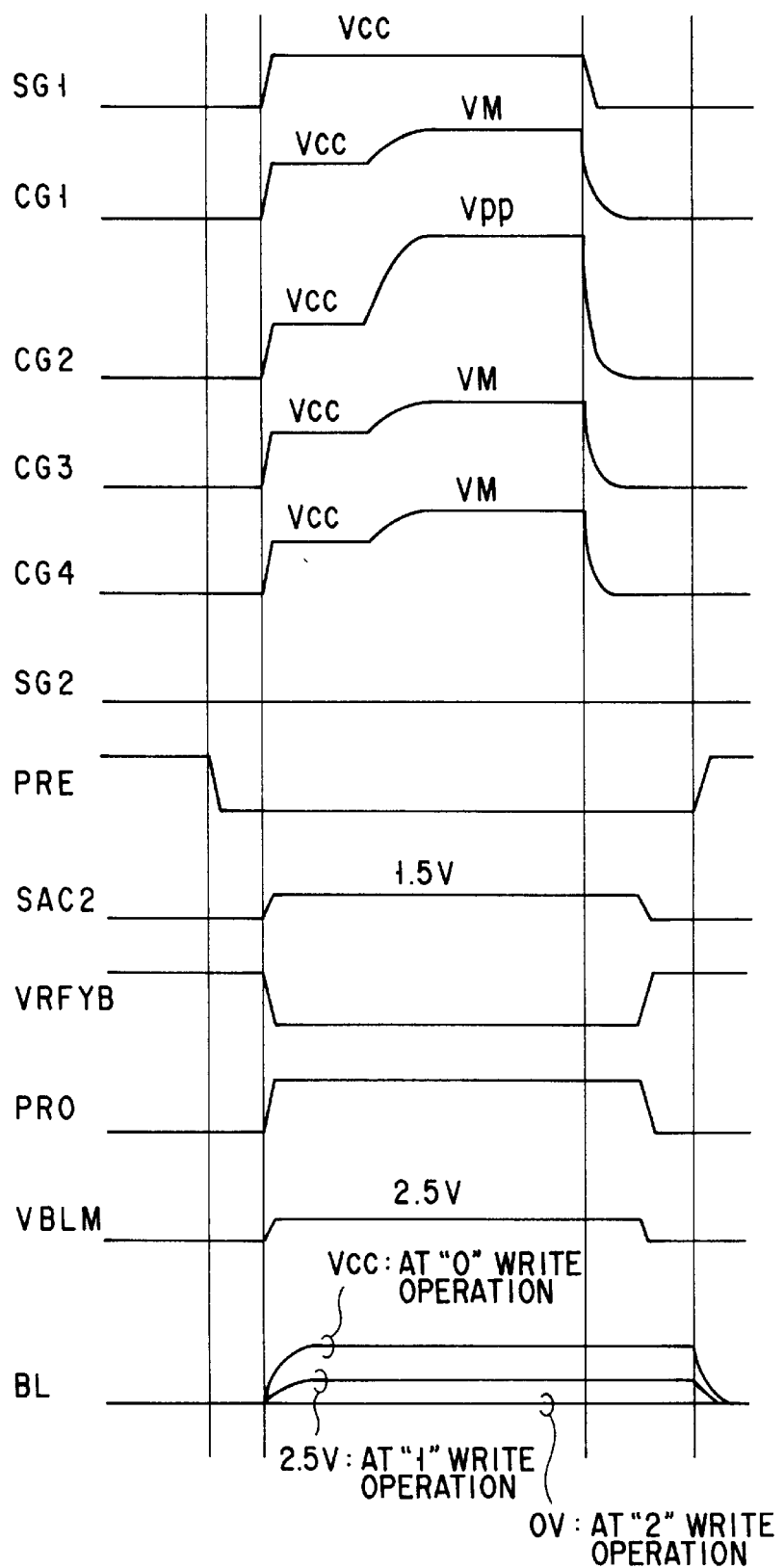
F I G. 24

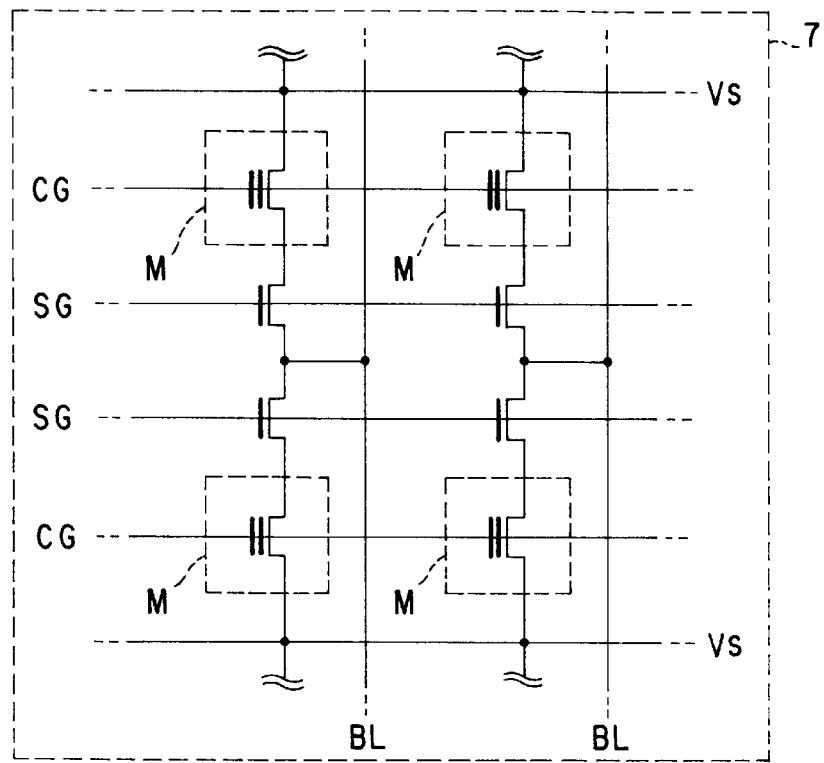
F I G. 26  NOR TYPE
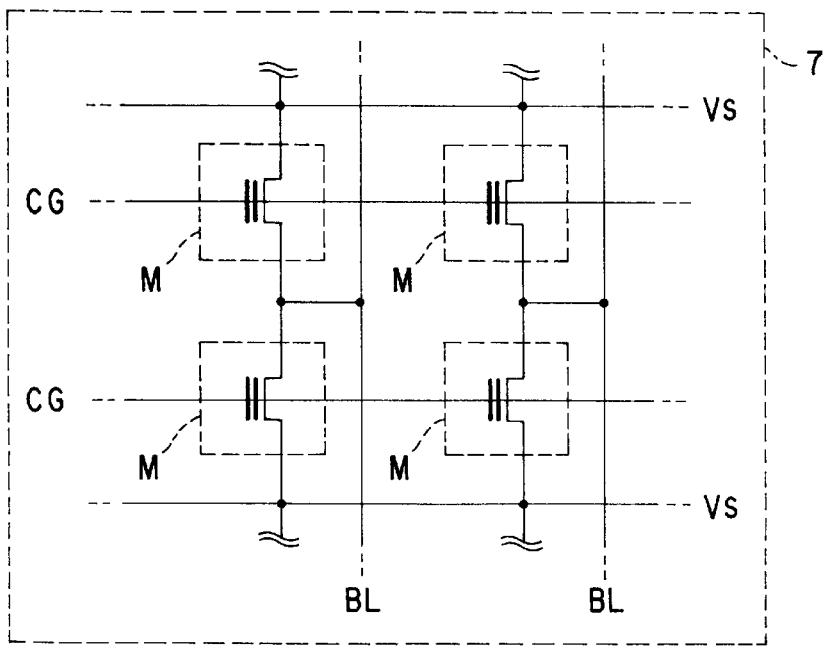
F I G. 27  NOR TYPE

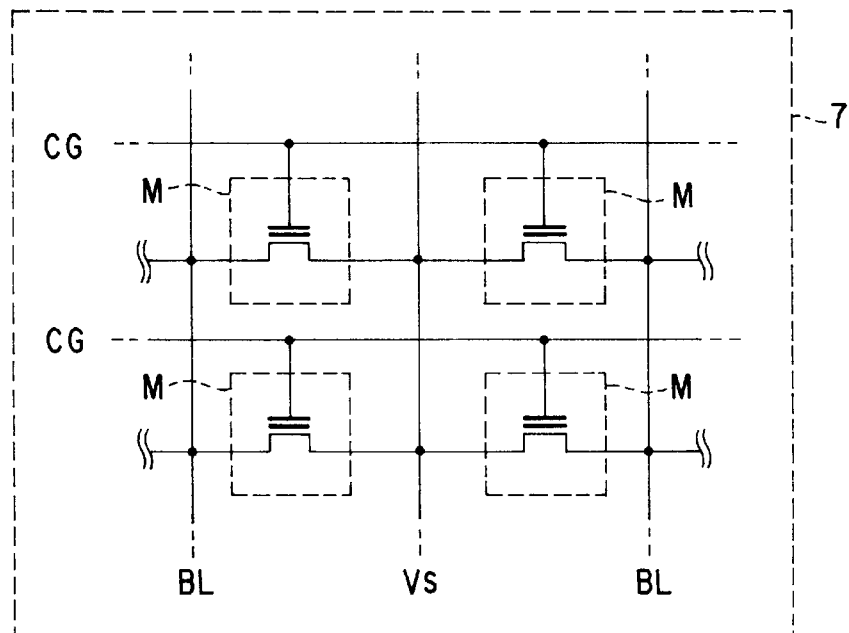
GROUND ARRAY TYPE (NOR TYPE)
F I G. 28
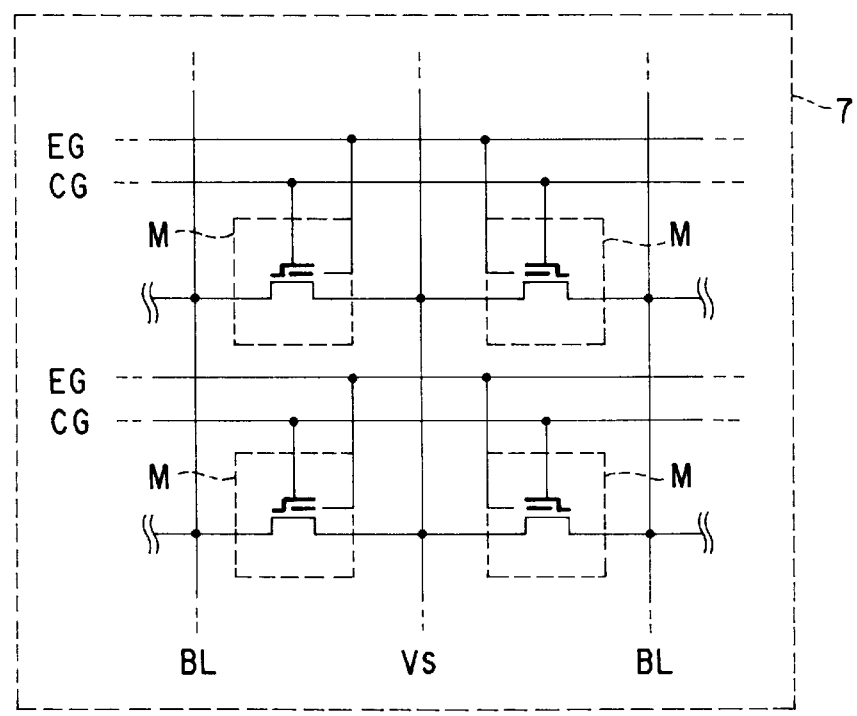
GROUND ARRAY TYPE (NOR TYPE)
F I G. 29

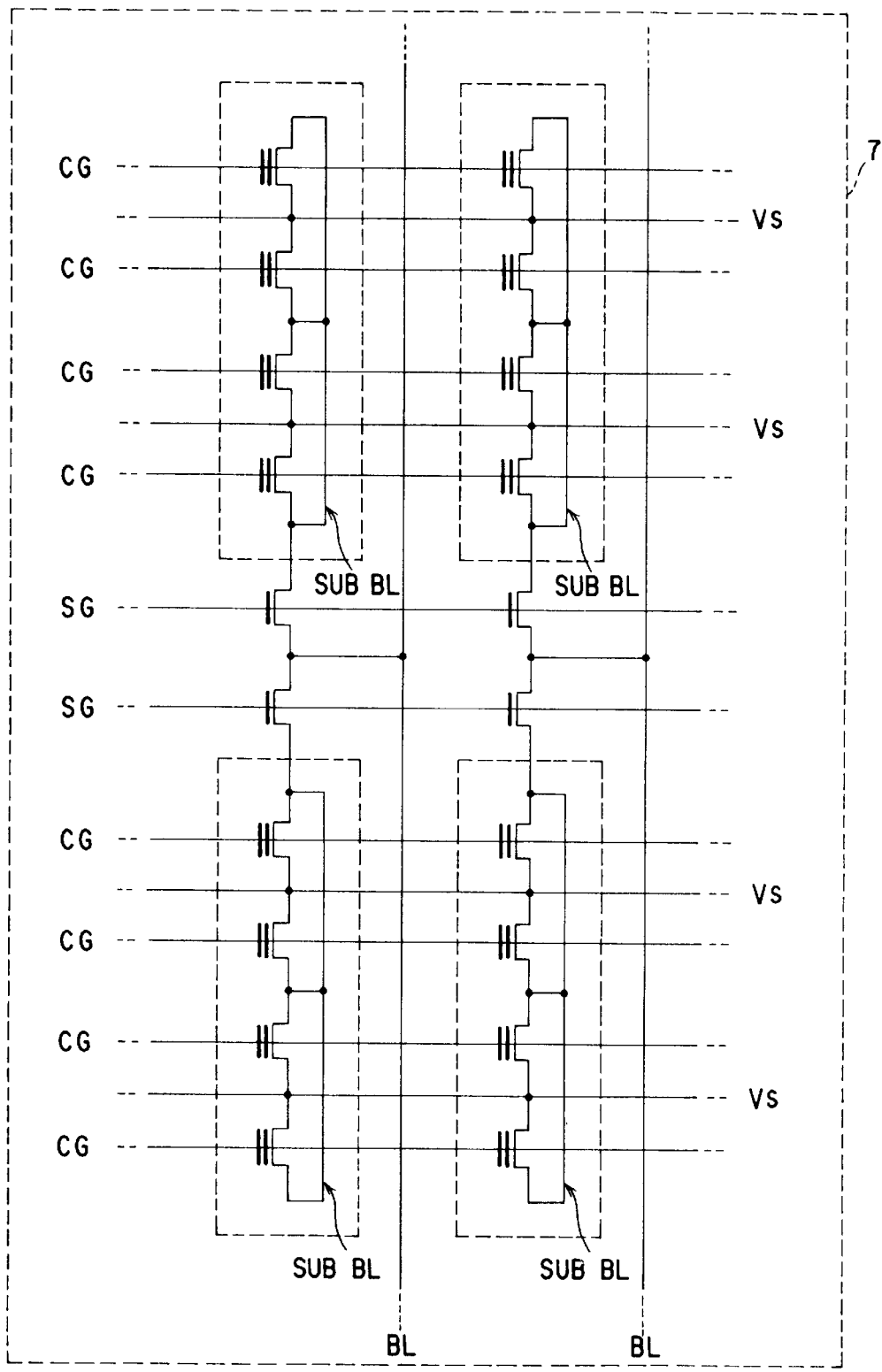
DIVIDED NOR TYPE (DINOR TYPE)
F I G. 32

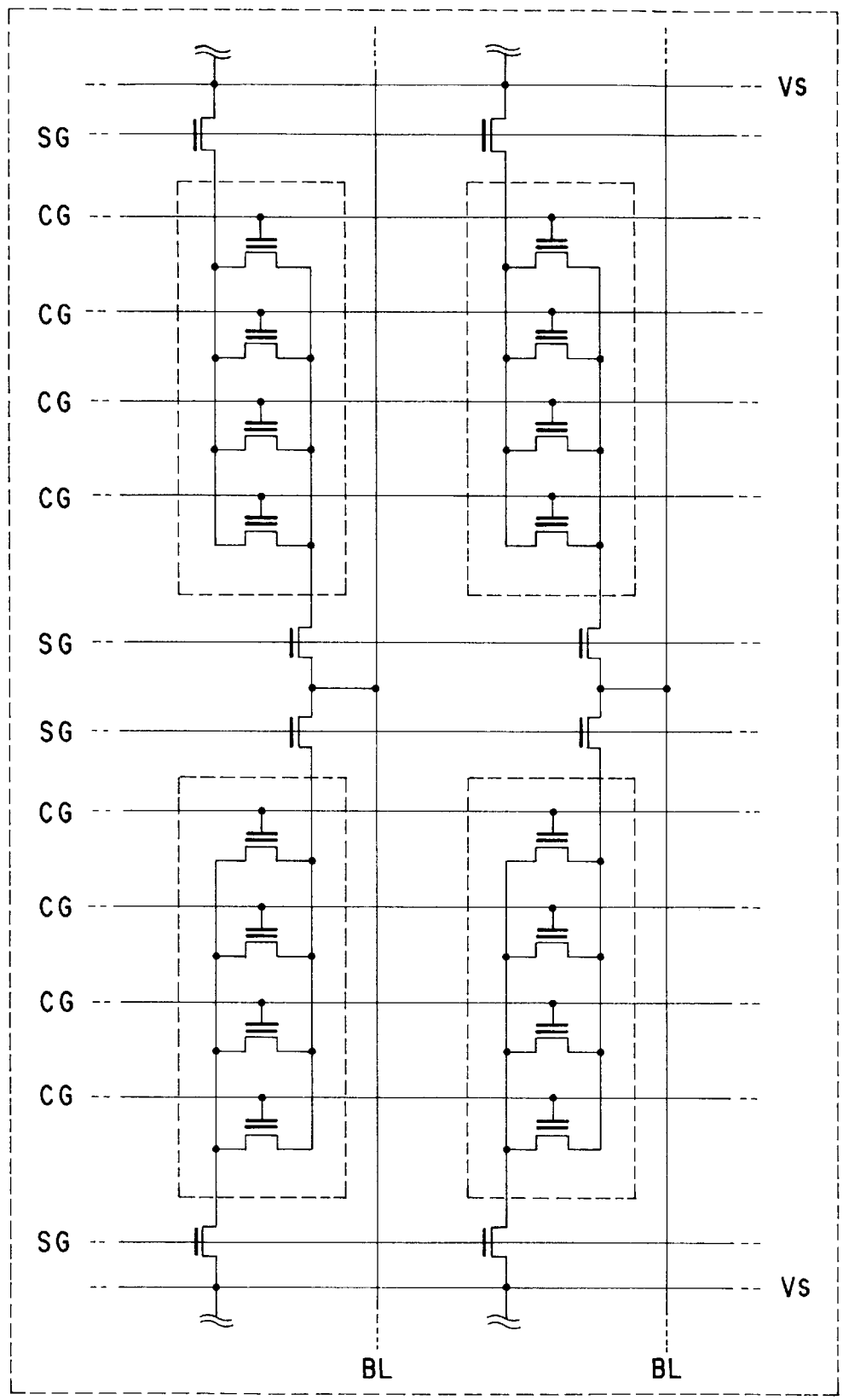
F I G. 33    AND TYPE

MULTI-LEVEL NONVOLATILE SEMICONDUCTOR MEMORY DEVICE HAVING IMPROVED PROGRAMMING LEVEL AND READ/WRITE MULTI-LEVEL DATA CIRCUITS

BACKGROUND OF THE INVENTION

1. Field of the Invention

The present invention relates to an electrically erasable programmable read-only memory (EEPROM) and, more specifically, to an EEPROM for storing multi-value information of more than one bit in a single memory cell.

2. Description of the Related Art

A memory cell having a MOSFET structure wherein a charge storage portion and a control gate are formed one on another on a semiconductor substrate, is known as one memory cell of an EEPROM. The memory cell usually stores data "0" or "1" in accordance with the number of charges stored in the charge storage portion, that is, it stores data of one bit in one cell. A multi-value data storing system for storing data of two bits or more in a single cell, is known to achieve a higher packed density type EEPROM. For example, in a 4-value data storing system, four different numbers of charges are stored in a charge storage portion in order to store data "0", "1", "2" and "3" in a single cell.

An example of the states of data stored by the 4-value data storing system will now be described. In this example, the following states are defined. The state in which the number of charges stored in a charge storage portion is zero is a neutral one, while the state in which a positive charge is stored in the neutral state is an erase one. The erase state corresponds to data "0". For example, an erase operation is performed when a high voltage (up to 20 V) is applied to a substrate and a control gate is set at 0 V. The states in which negative charges are stored in the neutral state are a data "1" state, a data "2" state and a data "3" state. The number of negative charges in the data "2" state is larger than that in the data "1" state and smaller than that in the data "3" state. The negative charges are stored in the charge storage portion by setting the substrate, source and drain to 0 V and applying a high voltage (up to 20 V) to the control gate.

Data stored in an EEPROM is generally assured for ten years; however, the charges stored in the charge storage portion leak very gradually. This leak makes data "0", "1", "2" and "3" to be confused with one another, so that the number of charges corresponding to each data is usually set discretely. The difference in the number of charges is called a charge number margin.

If the charge number margin is too small, data cannot be held for ten years. On the other hand, if the margin increases, the number of charges corresponding to, e.g., data "3" has to increase. For this reason, write time is lengthened and write voltage is heightened as compared with a normal memory cell for storing one-bit data. The larger the number of stored charges, the larger the number of leaking charges. Thus, the data hold period is not so lengthened that the charge number margin is increased.

An EEPROM to which data of plural bytes are written at once is known. This memory includes a data circuit for temporarily storing data of plural bytes in order to shorten the write time. To store multi-value data in the EEPROM, the data circuit has to be designed so as to store the multi-value data, with the result that the data circuit is increased in area.

As described above, the multi-value data storing system is effective means for achieving a high degree of integration, but has the following problems:

(1) The reliability of data assurance is lowered; and
(2) The control circuit such as a data circuit excluding a memory cell is increased in area.

SUMMARY OF THE INVENTION

An object of the present invention is to provide an EEPROM of a multi-value data storing system capable of lengthening a data hold period and improving in reliability.

Another object of the present invention is to provide an EEPROM of a multi-value data storing system capable of preventing a control circuit excluding a memory cell from increasing in area.

To attain the above objects, the present invention has the following constitution:

A first semiconductor memory device according to the first aspect of the present invention comprises: a memory cell including a charge storage section for storing n-value data ($n \geq 3$), wherein the charge storage section has discrete first to n-th charge amount regions for storing the n-value data and, if the first to n-th charge amount regions are defined as n-th, $(n-1)$-th, ..., $(i+1)$-th, i-th charge amount regions in descending order of an amount of positive or negative charge stored in the charge storage section, a charge amount difference $\Delta M_j$ between a j-th charge amount region and a $(j-1)$-th charge amount region is set to $\Delta M_n > \Delta M_{n-1} > ... > \Delta M_{i+2} > \Delta M_{i+1}$.

A second semiconductor memory device according to the first aspect of the present invention comprises: a memory cell including a charge storage section for storing n-value data ($n \geq 3$), the memory cell having a threshold voltage in discrete first to n-th threshold voltage regions determined in descending order of threshold voltage, the n-value data being stored in the first to n-th threshold voltage regions in accordance with an amount of charge stored in the charge storage section, and read out therefrom in accordance with a relationship in force between the threshold voltage of the memory cell and each of first to $(n-1)$-th read reference voltages, wherein a difference $\Delta V_j$ between the $(j-1)$-th read reference voltage and the maximum voltage of the j-th threshold voltage region is set to $\Delta V_n > \Delta V_{n-1} > ... > \Delta V_{i+2} > \Delta V_{i+1}$ ($i \geq 1$).

Another second semiconductor memory device according to the first aspect of the present invention comprises: a memory cell including a charge storage section for storing n-value data ($n \geq 3$), the memory cell having threshold voltage in discrete first to n-th threshold voltage regions determined in ascending order of threshold voltage, the n-value data being stored in the first to n-th threshold voltage regions in accordance with an amount of charge stored in the charge storage section, and read out therefrom in accordance with a relationship in force between the threshold voltage of the memory cell and each of first to $(n-1)$-th read reference voltages, wherein a difference $\Delta V_j$ between the minimum voltage of the j-th threshold voltage region and the $(j-1)$-th read reference voltage is set to $\Delta V_n > \Delta V_{n-1} > ... > \Delta V_{i+2} > \Delta V_{i+1}$ ($i \geq 1$).

A third semiconductor memory device according to the first aspect of the present invention comprises: a memory cell including a charge storage section for storing n-value data ($n \geq 3$), the memory cell having a read current in discrete first to n-th read current regions determined in ascending order of read current, the n-value data being stored in the first to n-th read current regions in accordance with an amount of charge stored in the charge storage section, and read out therefrom in accordance with a relationship in amount between the read current of the memory cell and each of first to (n−1)-th read reference current, wherein a difference $\Delta Ij$ between the minimum current of the j-th read current region and the (j−1)-th read reference current is set to $\Delta In > \Delta In-1 > \ldots > \Delta Ii+2 > \Delta Ii+1$ ($i \geq 1$).

Another third semiconductor memory device according to the first aspect of the present invention comprises: a memory cell including a charge storage section for storing n-value data ($n \geq 3$), the memory cell having a read current in discrete first to n-th read current regions determined in descending order of read current, the n-value data being stored in the first to n-th read current regions in accordance with an amount of charge stored in the charge storage section, and read out therefrom in accordance with a relationship in amount between the read current of the memory cell and each of first to (n−1)-th read reference current, wherein a difference $\Delta Ij$ between the (j−1)-th read reference current and the maximum current of the j-th read current region is set to $\Delta In > \Delta In-1 > \ldots > \Delta Ii+2 > \Delta Ii+1$ ($i \geq 1$).

The EEPROM according to the first aspect of the present invention stores n-value ($n \geq 3$) data in accordance with n charges stored in a charge storage portion of a memory cell. These n charges are set discretely. The larger the number of charges, the wider the charge number margin corresponding to a difference in the number of charges. The maximum number of charges can thus be reduced if a charge number margin for data corresponding to a relatively small number of charges is decreased, keeping the reliability of data corresponding to a relatively large number of charges. Consequently, according to the present invention, the EEPROM can be improved in reliability, while the write time and write voltage are prevented from increasing.

A first semiconductor memory device according to the second aspect of the present invention comprises: a memory cell having a charge storage section capable of n-value data ($n \geq 3$); and a data circuit for temporarily storing write data, the data circuit including n logic circuits each having n−1 input terminals.

In the nonvolatile semiconductor memory device, each of the n logic circuits has an output terminal connected to one of the n−1 input terminals of other n−1 logic circuits.

A second semiconductor memory device according to the second aspect of the present invention comprises: a memory cell having a charge storage section capable of n-value data ($n \geq 3$); a sense circuit for reading data stored in the memory cell; and a data circuit for temporarily storing the data read by the sense circuit, wherein the sense circuit includes n−1 switching circuits which are turned on/off in accordance with a value of read data, and the data circuit includes n logic circuits each having n−1 input terminals.

In the nonvolatile semiconductor memory device, each of the n−1 switching circuits connects a first MOS transistor supplied with a sense signal and a second MOS transistor supplied with the read data in series, and each of the n logic circuits has an output terminal connected to one of the n−1 input terminals of other n−1 logic circuits.

A third semiconductor memory device according to the second aspect of the present invention comprises: a memory cell array constituted of a plurality of memory cells each having a charge storage section for storing n-value data ($n \geq 3$); a plurality of bit lines; a plurality of word lines; and a plurality of program control circuits, wherein each of the plurality of program control circuits holds write control data for determining whether a write voltage is to be applied to a corresponding memory cell, selectively applies the write voltage to the memory cell according to held write control data, senses a write state of the memory cell, and selectively changes the held write control data in accordance with a predetermined logical relationship between write state of the memory cell and the write control data, and each of the plurality of program control circuits includes a data circuit for holding the write control data, the data circuit including n logic circuits each having n−1 input terminals.

In the nonvolatile semiconductor memory device, each of the n logic circuits has an output terminal connected to one of the n−1 input terminals of other n−1 logic circuits, each of the plurality of program control circuits includes a sense circuit for changing the write control data held in the data circuit in response to a signal of each of the bit lines, and each of the plurality of program control circuits includes n−1 switching circuits which are turned on/off in response to the signal of each of the bit lines in order to change the write control data held in the data circuit, and each of the n−1 switching circuits is constituted by connecting a first switching element supplied with a sense signal and a second switching element supplied with the signal of each of the bit lines in series.

A fourth semiconductor memory device according to the second aspect of the present invention comprises: a memory cell array constituted of a plurality of memory cells each having a charge storage section for storing n-value data ($n \geq 3$); a plurality of bit lines; a plurality of word lines; a plurality of program control circuits; and a plurality of data circuits, wherein the plurality of program control circuits select the memory cells and apply write control voltages thereto; the plurality of data circuits hold write control data of first to n-th logic levels for controlling the write control voltages applied to the memory cells selected by the plurality of program control circuits, selectively detect write states of the memory cells corresponding to the data circuits holding the write control data of logic levels other than the first logic level, change a logic level of write control data of a data circuit corresponding to a memory cell rendered in a predetermined write state to the first logic level, hold a logic level of write control data of a data circuit not in the predetermined write state, and hold a logic level of write control data of the data circuit holding the write control data of the first logic level; and each of the plurality of data circuits includes n logic circuits each having n−1 input terminals.

The following are preferred manners of the second aspect of the present invention:

(1) In the nonvolatile semiconductor memory, each of the n logic circuits has an output terminal connected to one of the n−1 input terminals of other n−1 logic circuits.

(2) In the nonvolatile semiconductor memory, each of the plurality of data circuits further includes a sense circuit for changing a logic level of the write control data held in each of the plurality of data circuits in response to a signal of corresponding one of the bit lines.

(3) In the nonvolatile semiconductor memory, each of the plurality of program control circuits includes n−1 switching circuits which are turned on/off in response to a signal of corresponding one of the bit lines in order to change the write control data held in the data circuit, and each of the n−1 switching circuits is constituted by connecting a first switching element supplied with a sense signal and a second switching element supplied with the signal of corresponding one of the bit lines in series.

In the EEPROM according to the second aspect of the present invention, since a data circuit for temporarily storing n-value write data is constituted of n logic circuits each having n−1 input terminals, a control circuit can be decreased in area.

As described above, according to the first aspect of the present invention, the larger the number of charges, the wider the charge number margin corresponding to a difference in the number of charges, thereby suppressing increase of write time and programming voltage to realize the EEPROM having high-reliability. According to the second aspect of the present invention, since a data circuit for temporarily storing n-value write data is constituted of n logic circuits each having n−1 input terminals, a control circuit can be decreased in area.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 1 is a cross-sectional view of the constitution of a memory cell according to a first embodiment of the present invention;

FIG. 2 is a graph of data hold characteristics of the memory cell according to the first embodiment;

FIG. 4 is a graph of the distribution of threshold voltages of memory cells according to the first embodiment;

FIG. 5 is a graph of the distribution of cell currents of memory cells according to the first embodiment;

FIG. 6 is a graph of data hold characteristics of memory cells according to the first embodiment;

FIG. 7 is a graph of the distribution of threshold voltages of memory cells according to the first embodiment;

FIG. 8 is a graph of the distribution of cell currents of memory cells according to the first embodiment;

FIG. 9 is a block diagram showing the constitution of an EEPROM according to the first embodiment;

FIG. 10 is a cross-sectional view showing the constitution of the EEPROM according to the first embodiment;

FIG. 11 is a view of the circuit arrangement of a memory cell array according to the first embodiment;

FIG. 12 is a circuit diagram specifically showing a data circuit according to the first embodiment;

FIG. 13 is a view depicting a modification to a stored multi-value data latch circuit according to the first embodiment;

FIG. 16 is a circuit diagram of the stored multi-value data latch circuit according to the first embodiment;

FIG. 17 is a timing chart showing a data read operation according to the first embodiment;

FIG. 19 is a timing chart showing a write verify operation according to the first embodiment;

FIG. 20 is a diagram specifically showing the arrangement of a cell-well control circuit according to the first embodiment;

FIG. 21 is a timing chart showing an operation of the cell-well control circuit according to the first embodiment;

FIG. 23 is a timing chart showing a data read operation according to the second embodiment;

FIG. 24 is a timing chart showing a data write operation according to the second embodiment;

FIG. 26 is a diagram showing a memory cell array of integrated NOR cells;

FIG. 27 is a diagram showing another memory cell array of integrated NOR cells;

FIG. 28 is a diagram showing an integrated ground array memory cells;

FIG. 29 is a diagram showing another integrated ground array memory cells;

FIG. 32 is a diagram showing an integrated memory cell array of DINOR (Divided NOR) memory cells; and FIG. 33 is a diagram showing a memory cell array of integrated AND cells.

DETAILED DESCRIPTION OF THE PREFERRED EMBODIMENTS

Figure 3:
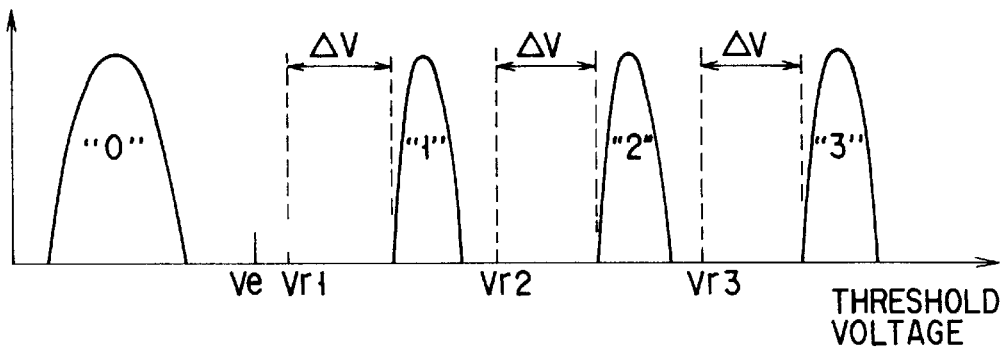
FIG. 3 is a graph of the distribution of threshold voltages of prior art memory cells.

Embodiments of the present invention will now be described with reference to the accompanying drawings.

(First Embodiment)

FIG. 1 illustrates the constitution of a memory cell M according to a first embodiment of the present invention. In the memory cell M, a tunnel insulative film 3 is formed on a p-type semiconductor substrate (or p-type well) 1, a floating gate (charge storage portion) 4 is formed on the tunnel insulative film 3, a gate insulative film 5 is formed on the floating gate 4, and a control gate 6 is formed on the gate insulative film 5. Furthermore, n-type diffusion layers 2 are provided as source and drain regions in a surface portion of the substrate 1. Data is stored in the memory cell M by controlling the number of charges stored in the floating gate 4.

The data is stored in the memory cell M in the following manner.

If a substrate voltage Vsub, a source voltage Vs and a drain voltage Vd are each set at a high voltage Vpp (e.g., 20 V) and a control gate voltage VCG is at 0 V, the charges are moved through the tunnel insulative film 3, and positive charges are stored in the floating gate 4. This corresponds to a data "0" state. If, in this state, the control gate voltage VCG is at a high voltage Vpp (e.g., 20 V) and the substrate voltage Vsub, source voltage Vs and drain voltage Vd are each at 0 V, negative charges are stored in the floating gate 4. Data "1", "2" and "3" are stored in three regions by controlling the number of negative charges for each of three regions. The threshold voltage Vt of the memory cell M is varied with the number of charges stored in the floating gate 4 and, actually, data is read out by detecting the voltage Vt.

The charges stored in the floating gate 4 leak over a long time. FIG. 2 shows an example of variations in threshold voltage Vt with time. Referring to FIG. 2, when the number of charges in the floating gate 4 is zero, the threshold voltage (neutral threshold voltage) is Ve. The larger the number of negative charges, the higher the threshold voltage Vt. Three voltages V1, V2 and V3 (V1<V2<V3) are given as the initial values of the threshold voltage Vt. The leakage of charges from the floating gate 4 continues until the number of charges becomes zero. Thus, the values V1, V2 and V3 gradually approach the neutral threshold voltage Ve as time elapses. The higher the threshold voltage, the higher the speed dV/dt at which the values V1, V2 and V3 approach the neutral threshold voltage Ve. This is because the number of leaking charges increases if the number of charges stored in the floating gate is large. For example, if the amounts of variations in threshold voltages V1, V2 and V3 over ten years are represented as $\Delta V1$, $\Delta V2$ and $\Delta V3$, the relationship among them is $\Delta V1 < \Delta V2 < \Delta V3$.

FIG. 3 is a graph showing the relationship between the threshold voltage and data of a prior art memory cell. Since in an EEPROM having a plurality of memory cells it is difficult to control all the memory cells so as to have the same threshold voltage, the threshold voltage corresponding to data fall within a certain range. In FIG. 3, the threshold voltage corresponding to data "0" is set to lower than Vr1. The threshold voltage is lower than the neutral threshold voltage Ve, and the number of charges stored in the floating gate is positive. The threshold voltage corresponding to data "1" is higher than Vr1 and lower than Vr2, the threshold voltage corresponding to data "2" is higher than Vr2 and lower than Vr3, and the threshold voltage corresponding to data "3" is higher than Vr3. In FIG. 3, Ve is lower than Vr1, and data "3", data "2" and data "1" are set in a descending order of the number of negative charges stored in the floating gate. The voltages Vr1, Vr2 and Vr3 are called reference voltages. Data is read out based on the relationship in force between the threshold voltages of the memory cells and the reference voltages.

A margin $\Delta V$ is provided between Vr1 and the minimum threshold voltage corresponding to data "1". When the threshold voltage corresponding to data "1" approaches Ve and becomes lower than Vr1 as time elapses, data "1" changes to data "0". The margin of $\Delta V$ is set to lengthen the data hold period of the memory cells. Similarly, a margin $\Delta V$ is provided between Vr2 and the minimum threshold voltage corresponding to data "2" and between Vr3 and the minimum threshold voltage corresponding to data "3".

As described above with reference to FIG. 2, the larger the number of charges stored in the floating gate, the larger the amount of variation in threshold voltage with time. Therefore, in the prior art shown in FIG. 3, the time required until data "2" changes to data "1" is shorter than the time required until data "1" changes to data "0" and the time required until data "3" changes to data "2" is much shorter. This is because the margin $\Delta V$ for holding each data is fixed.

FIG. 4 is a graph showing the relationship between threshold voltages of memory cells and data according to the present invention. A margin $\Delta V1$ is provided between Vr1 and the minimum threshold voltage corresponding to data "1", a margin $\Delta V2$ is provided between Vr2 and the minimum threshold voltage corresponding to data "2" and a margin $\Delta V3$ is provided between Vr3 and the minimum threshold voltage corresponding to data "3". These margins are set so as to satisfy the relationship $\Delta V1 < \Delta V2 < \Delta V3$. It is ideal that the time periods required until data "1" changes to data "0", data "2" changes to data "1" and data "1" changes to data "2" are set to be the same. Since, however, the above relationship is set among the margins, an extra margin $\Delta V1$ need not be provided in order to hold data "1".

As described above, if a threshold voltage margin of data whose threshold voltage slightly varies with time is small, the threshold voltage corresponding to each data can be decreased. Consequently, the number of charges stored in the floating gate can be reduced, and the write time can be shortened or the write voltage can be lowered.

The neutral threshold voltage Ve is lower than reference voltage Vr1 in FIG. 4, but the case where Ve is located between Vr1 and Vr2 will now be described. If $\Delta V2 < \Delta V3$, the time required until data "2" changes to data "1" and the time required until data "3" changes to data "2" can be almost equal to each other. Data "1" is not changed. The margins are thus set to satisfy the relationship $\Delta V1 < \Delta V2 < \Delta V3$.

There is a method of reading data by detecting a threshold voltage of a memory cell and, in this method, a reference voltage is applied to a control gate to sense whether or not a current flows through between source and drain regions. Since the reference voltage is applied to the control gate, a voltage stress is applied to the memory cell. This voltage stress may change data.

When Vr1<Vr2<Vr3<0 V in FIG. 4, if a negative voltage is applied to the control gate in the read mode and the substrate, source and drain are set to zero or a negative potential, the threshold voltage is changed in the negative direction by the voltage stress. If the speed at which the threshold voltage of the memory cell is changed by the voltage stress is remarkably higher than the speed at which the threshold voltage approaches the neutral threshold voltage Ve as time elapses, the relationship $\Delta V1 < \Delta V2 < \Delta V3$ is set even when Ve is higher than Vr3 as well as when Ve is lower than Vr1. When Ve >Vr3, the threshold voltage corresponding to data "1" is lower than that corresponding to data "2", and the number of charges stored in the floating gate is large. Consequently, the speed at which the threshold voltage corresponding to data "1" is varied by the voltage stress is lower than the speed at which the threshold voltage corresponding to data "2" is varied by the stress voltage. Similarly, the speed at which the threshold voltage corresponding to data "2" is varied is lower than the speed at which the threshold voltage corresponding to data "3" is varied.

If a margin for threshold voltages is large, a margin for the number of charges becomes large. In the actual memory device, not only the threshold voltage of a memory cell but also the current (cell current) flowing through the memory cell is caused to correspond to data. For example, a fixed voltage is applied to the control gate to detect a cell current flowing from the drain to the source. In an n-channel memory cell, the higher the threshold voltage, the smaller the cell current.

FIG. 5 is a graph showing the relationship between cell currents of memory cells and data according to the present invention. When the number of charges stored in the floating gate is zero, the neutral cell current is expressed as Ie. A margin $\Delta I1$ is provided between reference current Ir1 and the maximum cell current corresponding to data "1", a margin $\Delta I2$ is provided between reference current Ir2 and the maximum cell current corresponding to data "2", and a margin $\Delta I3$ is provided between reference current Ir3 and the maximum cell current corresponding to data "3". These margins are set to satisfy the relationship $\Delta I1 < \Delta I2 < \Delta I3$. It is the most ideal that the time periods required until data changes from "1" to "0", from "2" to "1" and from "3" to "2" are set to be the same. Since the above relationship in cell current is set, an extra cell current margin ΔI1 need not be provided to hold data.

As described above, if a cell current margin of data whose cell current slightly varies with time is small, the cell current corresponding to each data can be increased. Consequently, according to the present invention, the number of charges stored in the floating gate can be reduced, and the write time can be shortened or the write voltage can be lowered.

FIG. 6 shows variations in threshold voltage with time when positive charges are stored in the floating gate. The larger the number of positive charges, the lower the threshold voltage and the greater the variations with time. FIG. 7 shows the relationship between the threshold voltage of memory cells and data according to the present invention. As shown in FIG. 7, data "0", "1", "2" and "3" are set in a descending order of the threshold voltage, contrary to FIG. 4, so that the margins are determined so as to satisfy the relationship ΔV1<ΔV2<ΔV3. FIG. 8 shows the relationship between the cell current of memory cells and data according to the present invention. As shown in FIG. 8, data "0", "1", "2" and "3" are set in an ascending order of cell current, contrary to FIG. 5, so that the cell current margins are set to satisfy the relationship ΔI1<ΔI2<ΔI3.

As described above with reference to FIGS. 2 and 4 to 8, if a margin for the number of charges stored in the floating gate, a margin for the threshold voltage, or a margin for the cell current are set for each data in order to prevent data from being varied and destroyed due to various types of causes, the number of charges stored in the floating gate can be reduced. Consequently, according to the present invention, the write time can be shortened or the write voltage can be lowered. It depends upon the control circuit of a memory device whether the margin is secured by the number of charges, the threshold voltage, or the cell current.

In the above embodiment, the n-channel memory cell has been described by way of example, but the same advantage can be obtained from a p-channel memory cell.

FIG. 9 shows the fundamental constitution of a multi-value data storage type EEPROM including equivalents to the memory cell M shown in FIG. 1. An EEPROM of a ternary data storage type will be described by way of example. Referring to FIG. 9, the EEPROM includes a memory cell array 7 constituted of memory cells arranged in matrix and a word line selecting/ driving circuit 11 for selecting a memory cell and applying a write voltage and a read voltage to a control gate. The circuit 11 is connected to an address buffer 10 to receive an address signal. The EEPROM also includes a data circuit 8 for temporarily storing write data and reading data out of the memory cells. The data circuit 8 is connected to a data input/output buffer 9 to receive the address signal from the address buffer 10.

The data input/output buffer 9 inputs/outputs data to/from an external device of the EEPROM. The memory cell array 7 is provided on a p-type well 15 formed in an n-type well 14 formed in a p-type substrate 13, as shown in FIG. 10. The EEPROM includes a cell-well control circuit 12 for controlling the voltages of the n-type well 14 and p-type well 15.

FIG. 11 illustrates a specific constitution of the memory cell array 7 and a data circuit 8 connected thereto. The memory cell array 7 has a NAND cell constituted of memory cells M1 to M4 connected in series. Both ends of the NAND cell are connected to a bit line BL and a source line Vs through selective transistors S1 and S2, respectively. A group of memory cells having one control gate CG in common is one unit called "page" to and from which data are written and read simultaneously, while a group of memory cells connected to four control gates CG1 to CG4 is one unit called "block." The "page" and "block" are selected by the word line selecting/driving circuit 11. Data circuit 8-0 to 8-m are connected to bit lines BL0 to BLm to temporarily store data which is to be written to their corresponding memory cells.

FIG. 12 specifically shows the arrangement of the data circuit 8 as shown in FIGS. 9 and 11. In this data circuit 8, NAND logic circuits G1, G2 and G3 constitute a multi-value data latch circuit. One of nodes N1, N2 and N3 is at a low level, and the others are at a high level. Three-value data is latched according to which node is at a low level.

If four 3-input NAND logic circuits are connected to one another in such a manner that an output of each circuit can be supplied to the other three circuits, four-value data can be latched. If, in general, n (n−1)-input NAND logic circuits are connected to one another such that an output of each circuit can be supplied to the other (n−1) circuits, n-value data can be latched. The multi-value latch circuit can be constituted by replacing the NAND logic circuits with NOR logic circuits as shown in FIG. 13. In the arrangement shown in FIG. 13, one of three nodes N4, N5 and N6 is set at a high level.

Figure 15:
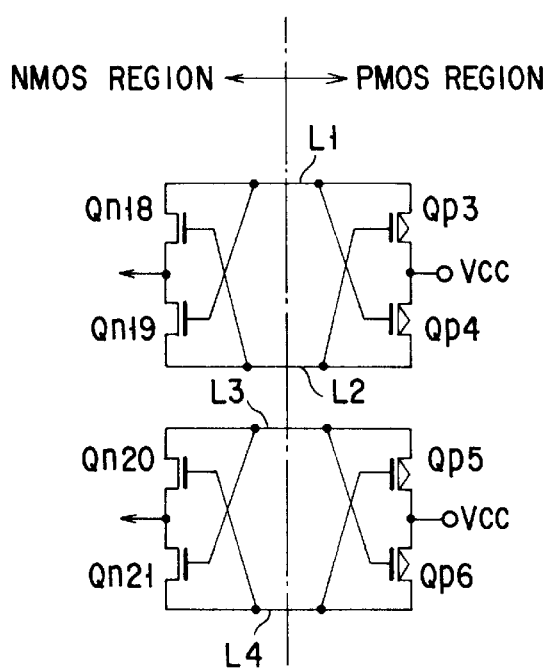
FIG. 15 is a circuit diagram of the prior art data latch circuit.
Figure 14:
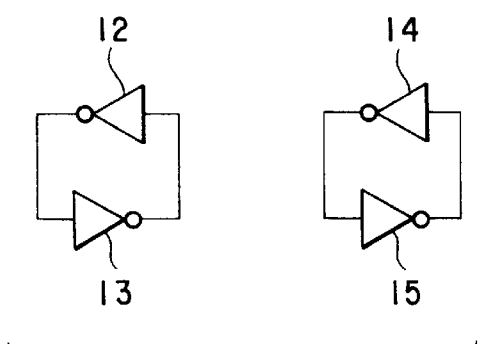
FIG. 14 is a view of a prior art data latch circuit.

FIG. 14 shows a prior art data latch circuit for latching 3-value data by both a one-bit data latch circuit including inverters I2 and I3 and another one-bit data latch circuit including inverters I4 and I5. FIG. 15 shows the arrangement of the data latch circuit shown in FIG. 14, while FIG. 16 does the arrangement of a multi-value data latch circuit constituted of NAND logic circuits G1, G2 and G3. The number of wires extending from a p-channel MOS region to an n-channel MOS region should be four in the data latch circuit of FIG. 14, whereas it is three in the multi-value data latch circuit having NAND logic circuits G1, G2 and G3. The advantage of the multi-value data latch circuit is that the area of the circuit can be reduced in virtue of the small number of wires.

In the data circuit 8 shown in FIG. 12, the data latch circuit is connected to data input/output lines IOA and IOB through n-channel MOS transistors Qn11 and Qn12. The data input/output lines IOA and IOB are also connected to the data input/output buffer 9 shown in FIG. 9. The gates of the n-channel MOS transistors Qn11 and Qn12 are connected to an output of a column address decoder constituted of a NAND logic circuit G4 and an inverter I1. A circuit constituted of n-channel MOS transistors Qn1 and Qn2 and a circuit constituted of n-channel MOS transistors Qn3 and Qn4 set activation signals SEN1 and SEN2 at a high level, respectively, and sense the bit line voltage to change data of the multi-value data latch circuit.

A circuit constituted of n-channel MOS transistors Qn5, Qn6, Qn7 and Qn8 and a p-channel MOS transistor Qp1 sets a signal BLC2 at a high level, and controls a bit line voltage in the write mode in accordance with data of the multi-value data latch circuit. An n-channel MOS transistor Qn9 sets a signal BLC1 at a high level and connects the data circuit 8 to the bit line BL, and an n-channel MOS transistor Qn10 sets a signal PRE at a high level and sets the bit line BL at a voltage VBLP. A high-voltage n-channel MOS transistor Hn33 is used to prevent a high voltage, which is to be applied to the bit line BL in the erase mode, from being applied to the data circuit, and its signal ERSB is at a high level except in the erase mode.

Figure 18:
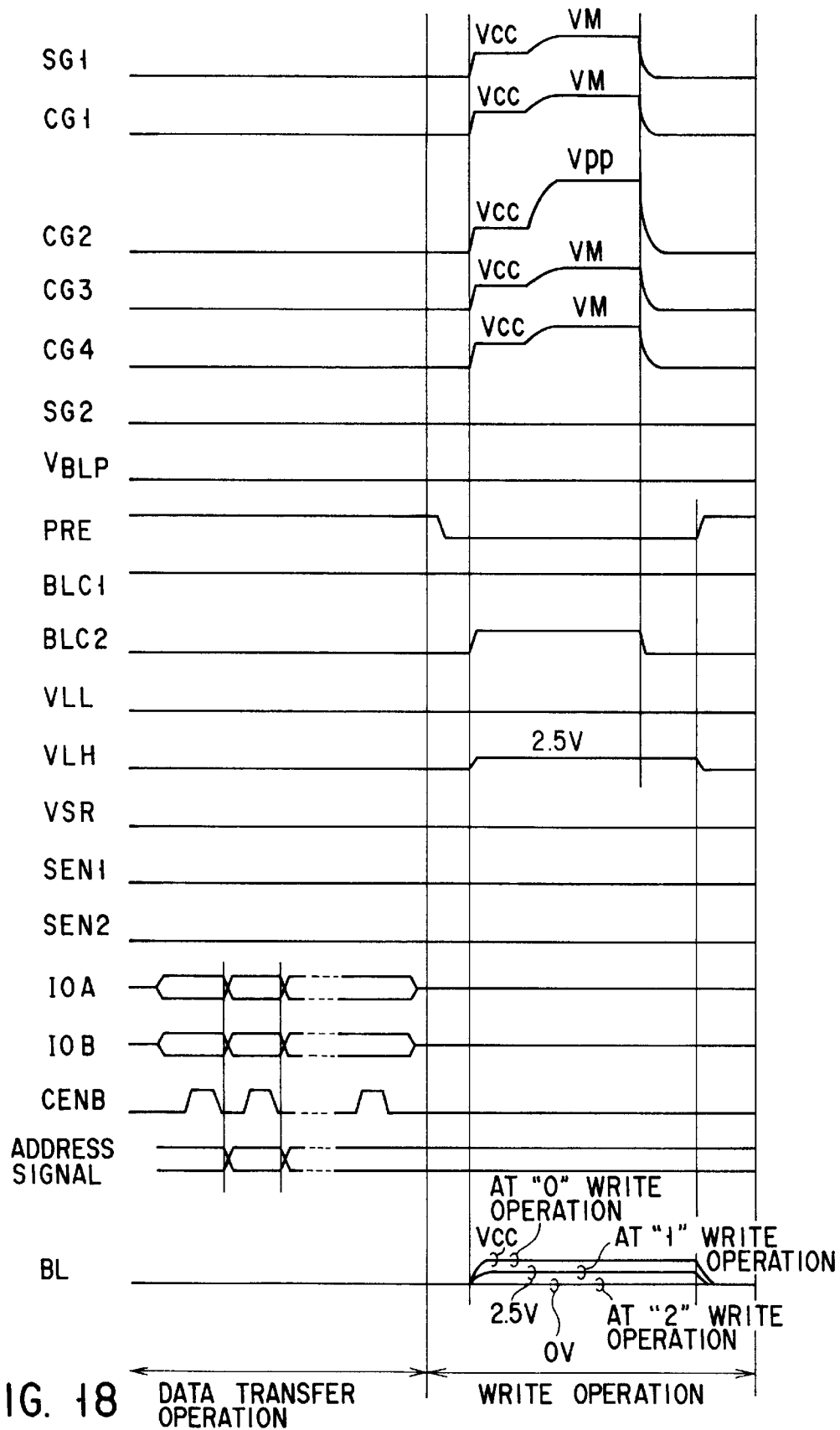
FIG. 18 is a timing chart showing a data write operation according to the first embodiment.

An operation of the EEPROM having the above configuration will now be described with reference to FIGS. 17 to 19. FIGS. 17 to 19 are timing charts showing a read operation, a write operation, and a write verify operation, respectively.

First a read operation will be described with reference to FIG. 17. The voltage VBLP is set at a power supply voltage Vcc (e.g., 5 V) and the bit line is set at a high level. Simultaneously, a voltage VSR is also set at Vcc, and signals SEN1 and SEN2 are set at a high level, and nodes N1 and N3 are reset at a high level, while a node N2 is reset to a low level. The signal PRE is at a low level and the bit line is rendered in a floating state. A selected control gate CG2 of the control gates connected to a block selected by the word line selecting/driving circuit 11 is set at 0 V, while the non-selected control gates CG1, CG3 and CG4 and select gates SG1 and SG2 are set at Vcc.

If the threshold voltage of a selected memory cell is 0 V or lower, the bit line voltage becomes low in level. If the threshold voltage is higher than 0 V, the bit line voltage remains high. Then the signal SEN1 becomes high. If the bit line is low, the n-channel MOS transistor Qn1 is turned off and the node N1 remains high. If the bit line is high, the n-channel MOS transistor Qn1 is turned on and the node N1 is set at a low level by the voltage VSR of 0 V.

The selected control gate is then set at 2 V. If the threshold voltage of the selected memory cell is 2 V or lower, the bit line voltage is low. If the threshold voltage is higher than 2 V, the bit line voltage remains high. The signal SEN2 then becomes high. If the bit line is low, the n-channel MOS transistor Qn3 is turned off and the node N3 remains high. If the bit line is high, the n-channel MOS transistor Qn3 is turned on and the node N3 is set at a low level by the voltage VSR of 0 V.

If a column enable signal CENB input to the column address decoder is high in level, data held in the data circuit selected by the address signal is supplied to the data input/output lines IOA and IOB and then outside the EEPROM through the data input/output buffer 9.

TABLE 1 shows the relationship among data stored in memory cells, threshold voltages, and levels of nodes N1, N2 and N3 after the data is read out.

TABLE 1

| Data | Threshold Voltage (x) | N1 | N2 | N3 |
|---|---|---|---|---|
| 0 | $x \leq 0\ V$ | H | L | H |
| 1 | $0.5\ V \leq x \leq 2\ V$ | L | H | H |
| 2 | $3\ V \leq x \leq Vcc$ | H | H | L |

Nine storage states can be provided in adjacent two memory cells, and 3-bit data is stored using eight of these states. The signals output to the data input/output lines IOA and IOB are converted into 3-bit data by the data input/output buffer 9 based on 3-valued information of adjacent even-numbered and odd-numbered two columns. The following is TABLE 2 representing a relationship between the storage states of the memory cells and input/output data is represented by the following TABLE 2.

TABLE 2

| Even-Numbered Column data | Odd-Numbered Column data | Input/Output data | | |
|---|---|---|---|---|
| 0 | 0 | 0 | 0 | 0 |
| 0 | 1 | 0 | 0 | 1 |
| 0 | 2 | 0 | 1 | 0 |

TABLE 2-continued

| Even-Numbered Column data | Odd-Numbered Column data | Input/Output data | | |
|---|---|---|---|---|
| 1 | 0 | 0 | 1 | 1 |
| 1 | 1 | 1 | 0 | 0 |
| 1 | 2 | 1 | 0 | 1 |
| 2 | 0 | 1 | 1 | 0 |
| 2 | 1 | 1 | 1 | 1 |

Secondly a write operation will be described with reference to FIG. 18. Prior to the write operation, input 3-bit data is converted into two 3-value data by the data input/output buffer 9, as indicated by TABLE 2, and input to data circuits of adjacent even-and odd-numbered columns. The relationship among the 3-value data, data input/output lines IOA and IOB, and nodes N1, N2 and N3 is shown by the following TABLE 3.

TABLE 3

| Three-Valued Data | IOA | IOB | N1 | N2 | N3 |
|---|---|---|---|---|---|
| 0 | H | H | L | H | H |
| 1 | L | H | H | L | H |
| 2 | H | L | H | H | L |

When the column enable signal CENB is high in level, the converted 3-value data is transferred to a data circuit of a column address designated by an address signal.

In the write operation, the signal PRE becomes low in level and the bit line is rendered in a floating state.

Then the signal BLC2 is set at a high level, and voltages VLH and VLL are set to 2.5 V and 0 V, respectively. Therefore, the power supply voltage Vcc, the voltage Vcc and the voltage VLL are output from the data circuit in which data "0" is held, the data circuit in which data "1" is held, and the data circuit in which data "2" is held, respectively, and applied to the bit line. If a voltage corresponding to the threshold voltages of n-channel MOS transistors Qn8 and Qn9 and high-voltage n-channel MOS transistor Hn33 is dropped, the signals BLC1, BLC2 and ERSB have only to increase in level.

The select gate SG1 of a block selected by the word line selecting/driving circuit 11 and the control gates CG1 to CG4 are set to the power supply voltage Vcc. The select gate SG2 is at 0 V. The selected control gate CG2 is set at a high voltage Vpp (e.g., 20 V), and the non-selected control gates CG1, CG3 and CG4 and the select gate SG1 are at a voltage VM (e.g., 10 V).

In a memory cell corresponding to the data circuit in which data "2" is held, electrons are injected into the floating gate due to a difference between the channel potential of 0 V and the voltage Vpp of the control gate, with the result that the threshold voltage of the memory cell is increased. In a memory cell corresponding to the data circuit in which data "1" is held, electrons are injected into the floating gate due to a difference between the channel potential of 2.5 V and the voltage Vpp of the control gate, with the result that the threshold voltage of the memory cell is increased. The reason why the channel potential is 2.5 V is that the number of electrons to be injected can be set smaller than that in the data circuit holding data "2". In a memory cell corresponding to the data circuit in which data "0" is held, since a difference between the channel potential and the voltage Vpp of the control gate is small, no electrons are injected effectively into the floating gate; therefore, the threshold voltage of the memory cell does not vary.

After the write operation, a threshold voltage of the memory cell is detected (write verify operation). If the threshold voltage reaches a desired value, data of the data circuit is changed to "0". If not, data of the data circuit is held and a write operation is performed again. The write operation and write verify operation are repeated until threshold voltages of all the selected memory cells reach desired values.

The write verify operation will now be described with reference to FIG. 19. First the voltage VBLP is set at a power supply voltage Vcc (e.g., 5 V) and the bit line becomes high in level. The signal PRE is at a low level and the bit line is rendered in a floating state. Subsequently, if the voltage VLH is at Vcc, the voltage VLL is at 0 V and the signal BLC2 becomes high in level, only the bit line BL corresponding to the data circuit in which data "2" is held is set at 0 V.

A selected control gate CG2 of the control gates connected to a block selected by the word line selecting/driving circuit 11 is set at 0.5 V, while the non-selected control gates CG1, CG3 and CG4 and select gates SG1 and SG2 are set at Vcc. If the threshold voltage of a selected memory cell is 0.5 V or lower,.the bit line voltage becomes low in level. If the threshold voltage is higher than 0.5 V, the bit line voltage remains high. Then the signal SEN1 becomes high. If the bit line is at a low level, the n-channel MOS transistor Qn1 is turned off and the level of the node N1 does not remain. If the bit line is at a high level, the n-channel MOS transistor Qn1 is turned on and the node N1 is set at a low level by the voltage VSR of 0 V. In other words, if data of the data circuit corresponding to the memory cell succeeding in writing data by the "1" data verify operation performed so far, is "1", it is changed to "0" and no other data is changed.

Then the voltage VBLP is set at the power supply voltage Vcc (e.g., 5 V) and the bit line becomes high in level. A selected control gate CG2 of the control gates connected to a block selected by the word line selecting/driving circuit 11 is set at 3 V, while the non-selected control gates CG1, CG3 and CG4 and select gates SG1 and SG2 are set at Vcc. If the threshold voltage of a selected memory cell is 3 V or lower, the bit line voltage becomes low in level. If the threshold voltage is higher than 3 V, the bit line voltage remains high. Then the signal SEN1 becomes high. If the bit line is at a low level, the n-channel MOS transistor Qn1 is turned off and the level of the node N1 does not remain. If the bit line is at a high level, the n-channel MOS transistor Qn1 is turned on and the node N1 is set at a low level by the voltage VSR of 0 V. In other words, if data of the data circuit corresponding to the memory cell succeeding in writing data by the "2" data verify operation performed so far, is "2", it is changed to "0" and no other data is changed.

If the threshold voltages of all the memory cells reach a desired value, the nodes N1 of all the data circuits become low in level. If, therefore, the levels of the nodes N of all the data circuits are low, the writing of data to the memory cells is completed. The following TABLE 4 shows the data conversion rule of the data circuit in the write verify mode.

TABLE 4

| Data of Data Circuit | 0 | 0 | 0 | 1 | 1 | 2 | 2 | 2 |
|---|---|---|---|---|---|---|---|---|
| Data of Memory Cell | 0 | 1 | 2 | 0 | 1 | 0 | 1 | 2 |
| Data of Data Circuit After Verify Operation | 0 | 0 | 0 | 1 | 0 | 2 | 2 | 0 |

As has been described referring to FIGS. 18 and 19, if a write operation is carried out in parallel with a verify operation, the threshold voltage of a memory cell corresponding to data "1" is set at a verify reference voltage ranging from 0.5 V to 2 V, while that of a memory cell corresponding to data "2" is set at a verify reference voltage ranging from 3 V to Vcc. As described above with reference to FIG. 17, the reference voltage in the read mode is 0 V and 2 V, so that the threshold voltage margin of data "1" is 0.5 V and that of data "2" is 1.0 V. The threshold voltage corresponding to data "0" is 0 V or lower, which is the same as that in the erase mode. The erase operation is performed by setting the cell well at a high voltage Vpp (e.g., 20 V) and setting the control gate CG at 0 V. The electrons are emitted from the floating gate and the threshold voltage is decreased to 0 V or lower.

FIG. 20 specifically shows the arrangement of the cell-well control circuit 12 in FIG. 9. In this circuit, high-voltage n-channel MOS transistors Hn17 to Hn28 constitute a booster circuit. If a pump enable signal PMP is set at a high level and an oscillating signal Φ is input, an output Vqq becomes a high voltage of Vcc or higher. The voltage Vqq is limited by a voltage limiter 16. When a booster circuit reset signal RSTB becomes low in level, the voltage Vqq is reset to Vcc. If a device standby signal STNBY becomes high in level, the power supply to the booster circuit is cut off. This is because if the threshold voltage of the high-voltage n-channel MOS transistor Hn is lowered to improve in voltage transfer efficiency, power consumption is increased in the standby state due to a leak current. When the level of a signal CWPMPB becomes low, the boosted voltage Vqq is applied to a cell well through high-voltage n-channel MOS transistors Hn10 and Hn11.

Referring to FIG. 21, an operation of the cell-well control circuit 12 will be described. In the standby state, the level of signal STNBY is high. The levels of signals RSTB and CWPMPB are also high, while those of signals PMP and Φ are low. The cell well is thus set at 0 V.

In the non-standby state excluding the erase state, the signals STNBY, RSTB and PMP are low in level, and the signal CWPMPB is high in level. The signal Φ oscillates. The voltage Vqq is set at Vcc, and the cell well is at 0 V.

In the erase state, the levels of the signals RSTB and PMP become high, and the voltage Vqq is boosted to Vpp. If the signal CWPMPB becomes low in level, the cell well is set at Vpp. The signal CWPMPB becomes high in level, and the cell well is reset to 0 V. The signals RSTB and PMP become low in level, and the voltage Vqq is reset to vcc.

(Second Embodiment)

Figure 22A:
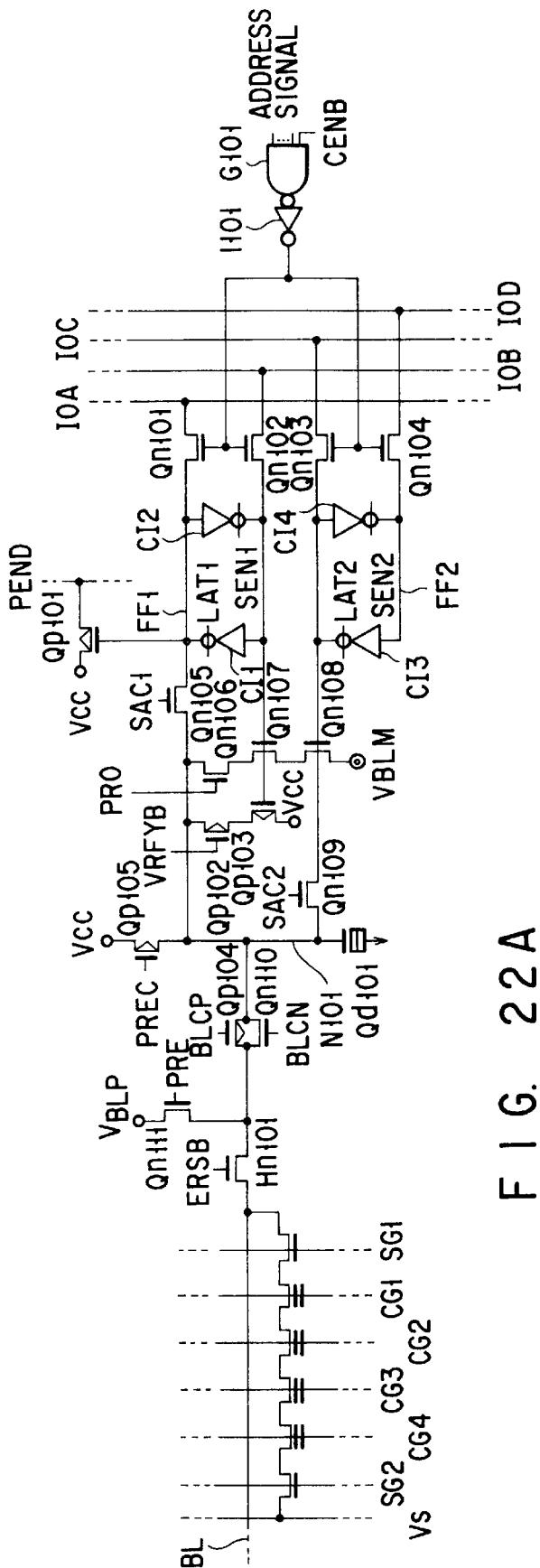
FIGS. 22A and 22B are diagrams specifically showing the arrangement of a data circuit according to a second embodiment of the present invention.
Figure 22B:
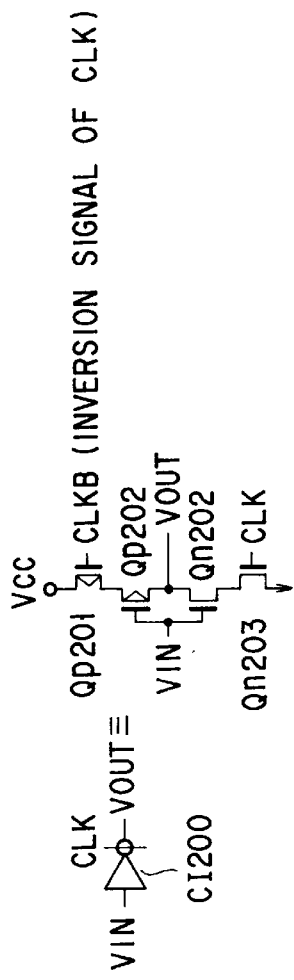

FIGS. 22A and 22B are views specifically depicting the arrangement of another embodiment of the data circuit 8 shown in FIGS. 9 and 11. This circuit is arranged so as to store 3-value data. As illustrated in FIG. 22A, clock-synchronous type inverters CI1 and CI2 constitute a flip-flop FF1 and clock-synchronous type inverters CI3 and CI4 constitute a flip-flop FF2, and these flip-flops latch write/read data. The flip-flops FF1 and FF2 also function as sense amplifiers. The arrangement of the clock-synchronous type inverter CI is specifically shown in FIG. 22B. In this embodiment, the circuit threshold voltage of the clock-synchronous type inverter CI is half the power supply voltage Vcc (e.g., 5 V).

The flip-flop FF1 latches information as to whether "0" is written or one of "1" and "2" is written" as write data, and senses and latches information as to whether a memory cell holds "0" or holds one of "1" and "2" as read data. The flip-flop FF2 latches information as to whether "2" is written or one of "1" and "0" is written" as write data, and senses and latches information as to whether a memory cell holds "2" or one of "1" and "0" as read data.

The flip-flop FF1 is connected to data input/output lines IOA and IOB via n-channel MOS transistors Qn101 and Qn102, respectively. The flip-flop FF2 is connected to data input/output lines IOC and IOD via n-channel MOS transistors Qn103 and Qn104, respectively. The data input/output lines IOA, IOB, IOC and IOD are also connected to the data input/output buffer 9 as shown in FIG. 9. The gates of the n-channel MOS transistors Qn101, Qn102, Qn103 and Qn104 are connected to an output of a column address decoder constituted of a NAND logic circuit G101 and an inverter I101.

N-channel MOS transistors Qn105 and Qn109 control the connection between the flip-flops FF1 and FF2 and MOS capacitor Qd101. A circuit constituted of n-channel MOS transistors Qn106, Qn107 and Qn108 and p-channel MOS transistors Qp102 and Qp103 changes the gate voltage of the MOS capacitor Qd101 in accordance with data of the flip-flops FF1 and FF2 in response to activation signal VREF or PRO. The MOS capacitor Qd101 is constituted by a depletion type n-channel MOS transistor and its capacity is considerably smaller than the bit line capacity. A p-channel MOS transistor Qp105 charges the MOS capacitor Qd101 in response to a signal PREC. A p-channel MOS transistor Qp101 is provided to detect data of the flip-flop FF1 and outputs a detection signal PEND indicating whether write data of all data circuits 8-0, 8-1, . . . , 8-m are "0" or not.

An n-channel MOS transistor Qn110 and a p-channel MOS transistor Qp104 control the connection between the data circuit 8 and bit line BL in response to signals BLCN and BLCP. An n-channel MOS transistor Qn111 sets the bit line BL at a voltage VBLP when the level of signal PRE becomes high. A high-voltage n-channel MOS transistor Hn101 is provided to prevent a high voltage, which is to be applied to the bit line in the erase mode, from being applied to the data circuit. A signal ERSB is at a high level except in the erase mode.

Figure 25:
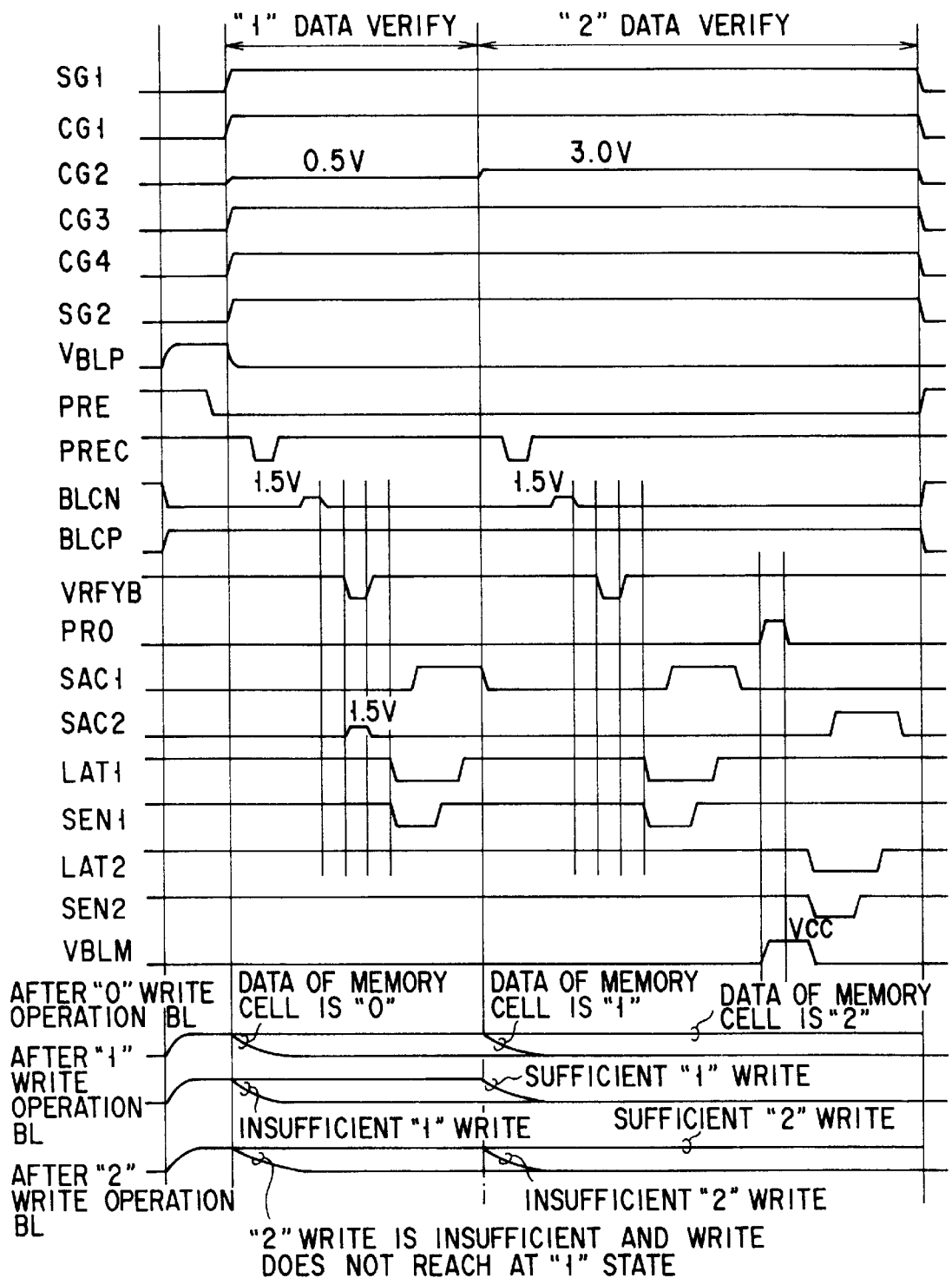
FIG. 25 is a timing chart showing a write verify operation according to the second embodiment.

An operation of an EEPROM having the foregoing data circuit, will now be described with reference to FIGS. 23, 24 and 25 which show timing of a read operation, that of a write operation, and that of a write verify operation, respectively.

Referring to FIG. 23, a read operation will be described. The voltage VBLP is set at the power supply voltage Vcc (e.g., 5 V) and the bit line is set at a high level. Simultaneously, the levels of signals BLCN and BLCP are set low and high, respectively, and the bit line and MOS capacitor Qd101 are separated from each other. The signal PRE is at a low level and the bit line is rendered in a floating state. The selected control gate CG2 of a block selected by the word line selecting/driving circuit 11 is set at 0 V, while the non-selected control gates CG1, CG3 and CG4 set at Vcc and so are the select gates SG1 and SG2.Vcc. The signal PREC is set low, and the MOS capacitor Qd101 is charged with Vcc.

If the threshold voltage of a selected memory cell is 0 V or lower, the bit line voltage becomes low. If the threshold voltage is higher than 0 V, the bit line voltage remains high. The signal BLCN is then set at, for example, 1.5 V which is lower than Vcc. When the threshold voltage of the n-channel MOS transistor Qn110 is 1 V, if the bit line voltage is 0.5 V or lower, the n-channel MOS transistor Qn110 is turned on and the node N101 is set at 0.5 V or lower. If the bit line voltage is higher than 0.5 V, the n-channel MOS transistor Qn110 is turned off and the node N101 is kept to Vcc.

The signal BLCN becomes low in level again, and the bit line BL and MOS capacitor Qd101 are separated. If the signals LAT1 and SEN1 are set low and the flip-flop FF1 is inactivated, a signal SAC1 becomes high. The signal SEN1 becomes high and so does the signal LAT1, with the result that the voltage of node N101 is sensed and latched. Therefore, the flip-flop FF1 senses whether data of a memory cell is "0" or not and latches the sensed information.

The selected control gate is then set at 2 V. If the threshold voltage of the selected memory cell is 2 V or lower, the bit line voltage becomes low. If the threshold voltage is higher than 2 V, the bit line voltage remains high. After that, the signal BLCN is set at 1.5 V which is lower than Vcc. When the threshold voltage of n-channel MOS transistor Qn110 is 1 V, if the bit line voltage is lower than 0.5 V, the n-channel MOS transistor Qn110 is turned on and the node N101 is lower than 0.5 V. If the bit line voltage is 0.5 V or higher, the n-channel MOS transistor Qn110 is turned off, and the node N101 is kept to Vcc.

The signal BLCN becomes low in level again, and the bit line BL and MOS capacitor Qd101 are separated. Signals LAT2 and SEN2 are set to a low level, the flip-flop FF2 is inactivated, and a signal SAC2 is set to a high level. Since the signal SEN2 becomes high in level and so does the signal LAT2, the voltage of the node N101 is sensed and latched. Therefore, the flip-flop FF1 senses whether data of a memory cell is "2" or not and latches the sensed information.

In the read mode, the levels of signals ERSB and VRFYB are high, and that of signal PRO is low. The voltages VBLM and Vs are set at 0 V.

When a column enable signal CENB input to the column address decoder becomes high in level, the data held in the data circuit selected by an address signal is supplied to the data input/output lines IOA, IOB, IOC and IOD and then outside the EEPROM through the data input/output buffer 9.

The relationship among data stored in memory cells, threshold voltages, and levels of data input/output lines IOA, IOB, IOC and IOD after the data is read out, is shown by the following TABLE 5:

TABLE 5

| Data | Threshold Voltage (x) | IOA | IOB | IOC | IOD |
|---|---|---|---|---|---|
| 0 | $x \leq 0$ V | L | H | L | H |
| 1 | $0.5$ V $\leq x \leq 2$ V | H | L | L | H |
| 2 | $3$ V $\leq x \leq$ Vcc | H | L | H | L |

Nine storage states can be set in adjacent two memory cells, and 3-bit data is stored using eight of these states. The signals supplied to the data input/output lines IOA, IOB, IOC and IOD are converted into 3-bit data by the data input/output buffer 9 based on 3-valued information of adjacent even-numbered and odd-numbered two columns. The relationship among these data is shown in the above TABLE 2.

A write operation will be described with reference to FIG. 24. Prior to the write operation, input 3-bit data is converted into two 3-value data by the data input/output buffer 9, as indicated by TABLE 2, and input to data circuits 8 of adjacent even- and odd-numbered columns. The relationship among the 3-value data, data input/output lines IOA, IOB, IOC and IOD is represented by the following TABLE 6.

TABLE 6

| Three-Value Data | IOA | IOB | IOC | IOD |
| --- | --- | --- | --- | --- |
| 0 | H | L | H | L |
| 1 | L | H | H | L |
| 2 | L | H | L | H |

When the level of the column enable signal CENB is high, the converted 3-value data is transferred to a data circuit of a column address designated by an address signal.

In the write operation, the signal PRE becomes low in level and the bit line is rendered in a floating state.

The signal VRFYB is set low, the signal PRO is set high, and the voltage VBLM is at 2.5 V. Therefore, the power supply voltage Vcc is applied to the bit line from the data circuit in which data "0" is held, and the voltage of 2.5 V is applied to the bit line from the data circuit in which data "1" is held. If the signal SAC2 is at 1.5 V, the voltage of 0 V is applied to the bit line from the data circuit in which data "2" is held. If the threshold voltage of n-channel MOS transistor Qn109 is 1 V, the n-channel MOS transistor Qn109 is turned off in the write state of "0" or "1", and turned on in the write state of "2". If a voltage corresponding to the threshold voltage of the high-voltage n-channel MOS transistor Hn101 is dropped, the signal ERSB has only to increase in level.

The select gate SG1 of a block selected by the word line selecting/driving circuit 11 and the control gates CG1 to CG4 are set to the power supply voltage Vcc. The select gate SG2 is at 0 V. The selected control gate CG2 is set at a high voltage Vpp (e.g., 20 V), and the non-selected control gates CG1, CG3 and CG4 are at a voltage VM (e.g., 10 V). In a memory cell corresponding to the data circuit in which data "2" is held, electrons are injected into the floating gate due to a difference between the channel potential of 0 V and the voltage Vpp of the control gate, with the result that the threshold voltage of the memory cell is increased. In a memory cell corresponding to the data circuit in which data "1" is held, electrons are injected into the floating gate due to a difference between the channel potential of 2.5 V and the voltage Vpp of the control gate, with the result that the threshold voltage of the memory cell is increased. The reason why the channel potential is 2.5 V is that the number of electrons to be injected can be set smaller than that in the data circuit holding data "2".

In a memory cell corresponding to the data circuit in which data "0" is held, since a difference between the channel potential and the voltage Vpp of the control gate is small, no electrons are injected effectively into the floating gate; thus, the threshold voltage of the memory cell does not vary. During the write operation, the levels of signals SEN1, LAT1, SEN2 and LAT2 are high, that of signal SAC1 is low, that of signal PREC is high, that of signal BLCN is high, that of BLCP is low, and that of signal ERSB is high.

After the write operation, a threshold voltage of the memory cell is detected (write verify operation). If the threshold voltage reaches a desired value, data of the data circuit is changed to "0". If not, data of the data circuit is held and a write operation is performed again. The write operation and write verify operation are repeated until threshold voltages of all the selected memory cells reach desired values.

The write verify operation will now be described with reference to FIG. 25.

First, the voltage VBLP is set at the power supply voltage Vcc (e.g., 5 V) and the bit line becomes high in level. Simultaneously, the level of signal BLCN becomes low and that of signal BLCP does high, and the bit line and MOS capacitor Qd101 are separated. The signal PRE is set low, and the bit line is rendered in a floating state. The selected control gate CG2 of a block selected by the word line selecting/driving circuit 11 is set at 0.5 V, while the non-selected control gates CG1, CG3 and CG4 and the select gates SG1 and SG2 are set at Vcc. The level of signal PREC becomes low and the MOS capacitor Qd101 is charged with Vcc.

If the threshold voltage of a selected memory cell is 0.5 V or lower, the bit line voltage becomes low. If the threshold voltage is higher than 0.5 V, the bit line voltage remains high. The signal BLCN is then set at, for example, 1.5 V which is lower than Vcc. When the threshold voltage of the n-channel MOS transistor Qn110 is 1 V, if the bit line voltage is 0.5 V or lower, the n-channel MOS transistor Qn110 is turned on and the node N101 is set at 0.5 V or lower. If the bit line voltage is higher than 0.5 V, the n-channel MOS transistor Qn110 is turned off and the node N101 is kept to Vcc.

The signal BLCN becomes low in level again, and the bit line BL and MOS capacitor Qd101 are separated. If the signal VRFYB becomes low, the p-channel MOS transistor Qp103 is turned on and the node N101 is set at Vcc only in the data circuit in which write data "0" is held. If the signal SAC2 is set at 1.5 V, the node N101 becomes 0 V only in the data circuit in which write data "2" is held. In the data circuit in which write data "1" is held, if the voltage of node N101 is 0.5 V or higher, it does not vary, whereas if the voltage is lower than 0.5 V, the node N101 is charged up to 0.5 V. If the signals LAT1 and SEN1 are set low and the flip-flop FF1 is inactivated, the level of signal SAC1 becomes high. The level of signal SEN1 is changed to high, as is that of signal LAT1, with the result that the voltage of node N101 is sensed and latched.

In this state, it is detected whether a memory cell is sufficient to write data "1" only in the data circuit in which write data "1" is held. If data of the memory cell is "1", the flip-flop FF1 senses and latches the voltage of node N101 to change the write data to "0". If not, the flip-flop FF1 senses and latches the voltage of node N101 to keep the write data to "1". The write data "0" or "2" held in the data circuit is not changed.

The selected control gate is then set at 3 V. If the threshold voltage of the selected memory cell is 3 V or lower, the bit line voltage becomes low. If the threshold voltage is higher than 3 V, the bit line voltage remains high. After that, the signal BLCN is set at 1.5 V which is lower than Vcc. When the threshold voltage of n-channel MOS transistor Qn110 is 1 V, if the bit line voltage is lower than 0.5 V, the n-channel MOS transistor Qn110 is turned on and the node N101 becomes lower than 0.5 V. If the bit line voltage is 0.5 V or higher, the n-channel MOS transistor Qn110 is turned off, and the node N101 is kept to Vcc.

The signal BLCN becomes low in level again, and the bit line BL and MOS capacitor Qd101 are separated. If the signal VRFYB becomes low, the p-channel MOS transistor Qp103 is turned on and the node N101 is set at Vcc only in the data circuit in which write data "0" is held. If the signals LAT1 and SEN1 are set low and the flip-flop FF1 is inactivated, the level of signal SAC1 becomes high . The level of signal SEN1 is changed to high, as is that of signal LAT1, with the result that the voltage of node N101 is sensed and latched.

The signal PRO becomes high and the voltage VBLM set to Vcc. The level of node N101 is changed to high only in the data circuit in which write data "1" is held. If the signals LAT2 and SEN2 are set low and the flip-flop FF2 is inactivated, the signal SAC2 becomes high in level. The level of signal SEN2 is changed to high and so is that of signal LAT2, with the result that the voltage of node N101 is sensed and latched.

It is detected whether a memory cell is sufficient to write data "2" only in the data circuit in which write data "2" is held. If data of the memory cell is "2", the flip-flops FF1 and FF2 sense and latch the voltage of node N101 to change the write data to "0". If not, the flip-flops FF1 and FF2 sense and latch the voltage of node N101 to keep the write data to "2". The write data "0" or "1" held in the data circuit is not changed.

During the write verify operation, the signal ERSB is at a high level and the voltage Vs is at 0 V.

It is understood from detection of signal PEND whether threshold voltages of all selected memory cells reach desired values. If they do so, all write data are "0" and all p-channel MOS transistors Qp101 for detecting respective data circuits 8-0, 8-1, . . . , 8-m are turned off. If it is detected whether the signal PEND is cut off from the power supply voltage Vcc, it can be confirmed whether the threshold voltages of all selected memory cells reach the desired values. The data conversion rule of the data circuit in the write verify operation is shown in TABLE 4.

As has been described with reference to FIGS. 24 and 25, if a write operation is carried out in parallel with a verify operation, the threshold voltage of a memory cell corresponding to data "1" is set at a verify reference voltage ranging from 0.5 V to 2 V, while that of a memory cell corresponding to data "2" is set at a verify reference voltage ranging from 3 V to Vcc. As described above referring to FIG. 23, since the reference voltages are 0 V and 2 V in the read operation, the threshold voltage margin of data "1" is 0.5 V and that of data "2" is 1.0 V. The threshold voltage corresponding to data "0" is 0 V or lower, which is the same as that in the erase operation.

The present invention is not limited to the above embodiments. In the embodiments, the present invention is applied to an EEPROM but can be applied to an EPROM.

Furthermore, in the above embodiments, the memory cells integrated in the memory cell array 7 are NAND memory cells. However, the present invention is not limited to the NAND memory cells, but various types of memory cells can be employed. For example, the present invention can be practiced even by the use of the following type of memory cells. In FIGS. 26 to 33, the same elements as those in FIG. 11 are denoted by the same symbols and their detailed descriptions are omitted.

FIG. 26 shows a memory cell array of integrated NOR cells. The NOR cells are connected to bit lines BL through select gates.

FIG. 27 shows another memory cell array of integrated NOR cells. The NOR cells are directly connected to bit lines BL.

FIG. 28 shows a memory cell array of integrated ground array memory cells. As shown in FIG. 28, in this ground array memory cell, bit lines BL and source lines VS are arranged in parallel to each other. The cells constituting the array are NOR memory cells.

FIG. 29 illustrates another memory cell array of integrated ground array memory cells. This array is of a so-called split channel type and thus includes erase gates EG used for erasing data and control gates CG.

Figure 30:
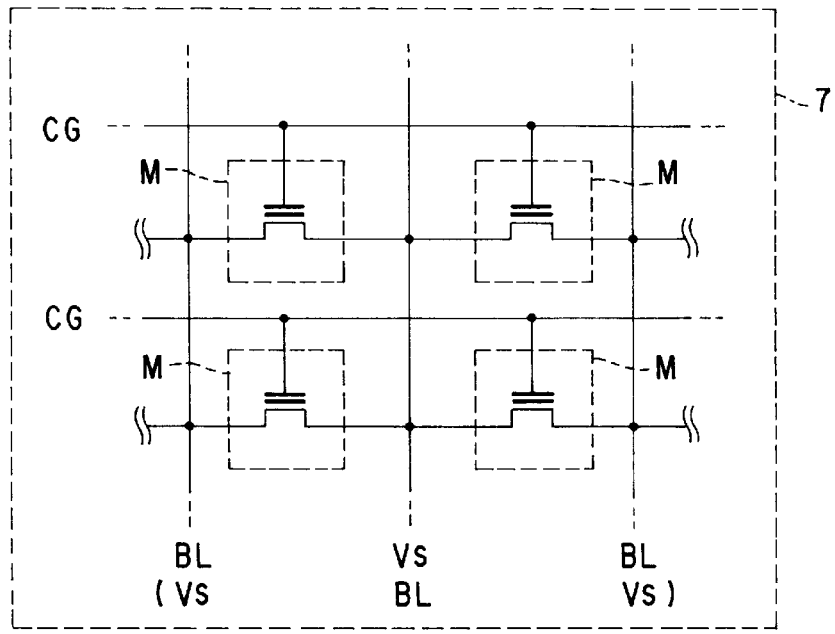
FIG. 30 is a diagram showing an integrated alternate ground array memory cells.

FIG. 30 shows a memory cell array of integrated alternate ground array memory cells. The array of FIG. 30 is the same as that of the ground array memory cells in that the bit lines BL and source lines VS are arranged in parallel to each other, but differs therefrom in that the bit lines BL and source lines VS are alternate with each other.

Figure 31:
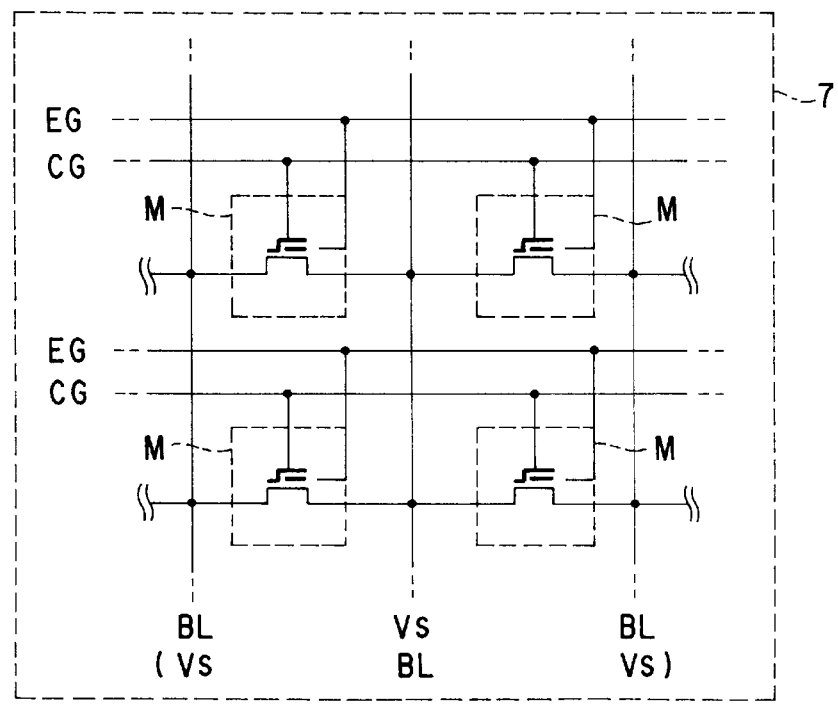
FIG. 31 is a diagram showing another integrated alternate ground array memory cells.

FIG. 31 depicts another memory cell array of integrated alternate ground array memory cells. This array has the arrangement similar to that of the ground array shown in FIG. 29.

FIG. 32 shows a DINOR (Divided NOR) memory cell array of integrated cells. As shown in FIG. 32, four memory cell transistors are connected in parallel, with a bit line side selective transistor between a bit line BL and a source line VS.

FIG. 33 shows a memory cell array of integrated AND cells. In FIG. 33, four memory cell transistors are connected in parallel, with a bit line selective transistor between a bit line BL and a source line VS.

In the above embodiments using NAND memory cells, the threshold voltage margin can be secured by controlling both the reference potentials in the read and write verify operations. On the other hand, the cell current margin can be secured by controlling both the reference currents in the read and verify operations. Moreover, in the above embodiments, 3-value data or 4-value data is stored in a memory cell; however, the present invention can be practiced irrespective of the number of values of data to be stored. Various changes and modifications can be made without departing from the scope of the subject matter of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory device comprising a memory cell including a charge storage section for storing n-value data ($n \geq 3$), wherein
    said charge storage section has discrete first to n-th charge amount regions for storing the n-value data and, if said first to n-th charge amount regions are defined as n-th, $(n-1)$-th, . . . , $(i+1)$-th, i-th charge amount regions in descending order of an amount of positive or negative charge stored in said charge storage section, a charge amount difference $\Delta Mj$ between a j-th charge amount region and a $(j-1)$-th charge amount region is set to $\Delta Mn > \Delta Mn-1 > \ldots > \Delta Mi+2 > \Delta Mi+1$.

2. A nonvolatile semiconductor memory device comprising a memory cell including a charge storage section for storing n-value data ($n \geq 3$), said memory cell having a threshold voltage in discrete first to n-th threshold voltage regions determined in descending order of threshold voltage, said n-value data being stored in the first to n-th threshold voltage regions in accordance with an amount of charge stored in said charge storage section, and read out therefrom in accordance with a relationship in force between the threshold voltage of memory cell and each of first to $(n-1)$-th read reference voltages,
    wherein a difference $\Delta Vj$ between the $(j-1)$-th read reference voltage and the maximum voltage of the j-th threshold voltage region is set to $\Delta Vn > \Delta Vn-1 > \ldots > \Delta Vi+2 > \Delta Vi+1$ ($i \geq 1$).

3. A nonvolatile semiconductor memory device comprising a memory cell including a charge storage section for storing n-value data ($n \geq 3$), said memory cell having a threshold voltage in discrete first to n-th threshold voltage regions determined in ascending order of threshold voltage, said n-value data being stored in the first to n-th threshold voltage regions in accordance with an amount of charge stored in said charge storage section, and read out therefrom in accordance with a relationship in force between the threshold voltage of said memory cell and each of first to (n−1)-th read reference voltages, wherein a difference $\Delta Vj$ between the minimum voltage of the j-th threshold voltage region and the (j−1)-th read reference voltage is set to $\Delta Vn > \Delta Vn-1 > \ldots > \Delta Vi+2 > \Delta Vi+1$ ($i \geq 1$).

4. A nonvolatile semiconductor memory device comprising a memory cell including a charge storage section for storing n-value data ($n \geq 3$), said memory cell having a read current in discrete first to n-th read current regions determined in ascending order of read current, said n-value data being stored in the first to n-th read current regions in accordance with an amount of charge stored in said charge storage section, and read out therefrom in accordance with a relationship in amount between the read current of said memory cell and each of first to (n−1)-th read reference current, wherein a difference $\Delta Ij$ between the minimum current of the j-th read current region and the (j−1)-th read reference current is set to $\Delta In > \Delta In-1 > \ldots > \Delta Ii+2 > \Delta Ii+1$ ($i \geq 1$).

5. A nonvolatile semiconductor memory device comprising a memory cell including a charge storage section for storing n-value data ($n \geq 3$), said memory cell having a read current in discrete first to n-th read current regions determined in descending order of read current, said n-value data being stored in the first to n-th read current regions in accordance with an amount of charge stored in said charge storage section, and read out therefrom in accordance with a relationship in amount between the read current of said memory cell and each of first to (n−1)-th read reference current, wherein a difference $\Delta Ij$ between the (j−1)-th read reference current and the maximum current of the j-th read current region is set to $\Delta In > \Delta In-1 > \ldots > \Delta Ii+2 > \Delta Ii+1$ ($i \geq 1$).

6. A nonvolatile semiconductor memory device comprising:
- a memory cell having a charge storage section capable of n-value data ($n \geq 3$); and
- a data circuit for temporarily storing write data, said data circuit including n logic circuits each having n−1 input terminals.

7. The nonvolatile semiconductor memory device according to claim 6, wherein each of said n logic circuits has an output terminal connected to one of the n−1 input terminals of other n−1 logic circuits.

8. A nonvolatile semiconductor memory device comprising:
- a memory cell having a charge storage section capable of n-value data ($n \geq 3$);
- a sense circuit for reading data stored in said memory cell; and
- a data circuit for temporarily storing the data read by said sense circuit,
- wherein said sense circuit includes n−1 switching circuits which are turned on/off in accordance with a value of read data, and said data circuit includes n logic circuits each having n−1 input terminals.

9. The nonvolatile semiconductor memory device according to claim 8, wherein each of said n−1 switching circuits includes a first MOS transistor supplied with a sense signal and a second MOS transistor supplied with the read data which are connected in series, and each of said n logic circuits has an output terminal connected to one of the n−1 input terminals of other n−1 logic circuits.

10. A nonvolatile semiconductor memory device comprising:
- a memory cell array constituted of a plurality of memory cells each having a charge storage section for storing n-value data ($n \geq 3$);
- a plurality of bit lines;
- a plurality of word lines; and
- a plurality of program control circuits, wherein each of said plurality of program control circuits holds write control data for determining whether a write voltage is to be applied to a corresponding memory cell, selectively applies the write voltage to the memory cell according to held write control data, senses a write state of the memory cell, and selectively changes the held write control data in accordance with a predetermined logical relationship between write state of the memory cell and the write control data, and each of said plurality of program control circuits includes a data circuit for holding the write control data, said data circuit including n logic circuits each having n−1 input terminals.

11. The nonvolatile semiconductor memory device according to claim 10, wherein each of said n logic circuits has an output terminal connected to one of the n−1 input terminals of other n−1 logic circuits.

12. The nonvolatile semiconductor memory device according to claim 11, wherein each of said plurality of program control circuits includes a sense circuit for changing the write control data held in said data circuit in response to a signal of corresponding one of said bit lines.

13. The nonvolatile semiconductor memory device according to claim 11, wherein each of said plurality of program control circuits includes n−1 switching circuits which are turned on/off in response to a signal of corresponding one of said bit lines in order to change the write control data held in said data circuit, and each of said n−1 switching circuits is constituted by connecting a first switching element supplied with a sense signal and a second switching element supplied with the signal of corresponding one of said bit lines in series.

14. A nonvolatile semiconductor memory device comprising:
- a memory cell array constituted of a plurality of memory cells each having a charge storage section for storing n-value data ($n \geq 3$);
- a plurality of bit lines;
- a plurality of word lines;
- a plurality of program control circuits; and
- a plurality of data circuits, wherein said plurality of program control circuits select the memory cells and apply write control voltages thereto, said plurality of data circuits hold write control data of first to n-th logic levels for controlling the write control voltages applied to the memory cells selected by said plurality of program control circuits, selectively detect write states of the memory cells corresponding to said data circuits holding the write control data of logic levels other than the first logic level, change a logic level of write control data of a data circuit corresponding to a memory cell rendered in a predetermined write state to the first logic level, hold a logic level of write control data of a data circuit corresponding to a memory cell not rendered in a predetermined write state, and hold a logic level of write control data of the data circuit holding the write control data of the first logic level, and each of said plurality of data circuits includes n logic circuits each having n−1 input terminals.

15. The nonvolatile semiconductor memory device according to claim 14, wherein each of said n logic circuits has an output terminal connected to one of the n−1 input terminals of other n−1 logic circuits.

16. The nonvolatile semiconductor memory device according to claim 15, wherein each of said plurality of data circuits further includes a sense circuit for changing a logic level of the write control data held in each of said plurality of data circuits in response to a signal of corresponding one of said bit lines.

17. The nonvolatile semiconductor memory device according to claim 15, wherein each of said plurality of data circuits includes n−1 switching circuits which are turned on/off in response to a signal of corresponding one of said bit lines in order to change the write control data held in said data circuit, and each of said n−1 switching circuits is constituted by connecting a first switching element supplied with a sense signal and a second switching element supplied with the signal of corresponding one of said bit lines in series.

* * * * *